United States Patent
Wei

(10) Patent No.: US 10,680,412 B2
(45) Date of Patent: Jun. 9, 2020

(54) OPTICAL COUPLING CONNECTOR, OPTICAL COUPLING SYSTEM, AND WAVEGUIDE COUPLING METHOD

(71) Applicant: HUAWEI TECHNOLOGIES CO., LTD., Shenzhen, Guangdong (CN)

(72) Inventor: Yuming Wei, Shenzhen (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 95 days.

(21) Appl. No.: 16/119,361

(22) Filed: Aug. 31, 2018

(65) Prior Publication Data

US 2018/0375289 A1    Dec. 27, 2018

Related U.S. Application Data

(63) Continuation of application No. PCT/CN2017/071703, filed on Jan. 19, 2017.

(30) Foreign Application Priority Data

Mar. 9, 2016 (CN) .......................... 2016 1 0131683

(51) Int. Cl.
*H01S 3/00* (2006.01)
*H01S 5/22* (2006.01)
(Continued)

(52) U.S. Cl.
CPC ............ *H01S 5/22* (2013.01); *G02B 6/12002* (2013.01); *G02B 6/125* (2013.01); *G02B 6/30* (2013.01);
(Continued)

(58) Field of Classification Search
CPC ............ H01S 3/094057; H01S 3/0637; H01S 3/1608; H01S 3/094053; H01S 3/1618;
(Continued)

(56) References Cited

U.S. PATENT DOCUMENTS 6,310,995 B1   10/2001  Saini et al.
6,462,864 B1   10/2002  Lange et al.
(Continued)

FOREIGN PATENT DOCUMENTS

CN   101641622 A   2/2010
CN   102159975 A   8/2011
(Continued)

OTHER PUBLICATIONS

J. K. Doylend et al, Design and Simulation of an Integrated Fiber-to-Chip Coupler for Silicon-on-Insulator Waveguides. IEEE Journal of Selected Topics in Quantum Electronics ( vol. 12, Issue: 6, Nov.-Dec. 2006 ), 8 pages.
(Continued)

*Primary Examiner* — Mark Hellner
(74) *Attorney, Agent, or Firm* — Womble Bond Dickinson (US) LLP

(57) ABSTRACT

An optical coupling connector, an optical coupling system, and a waveguide coupling method are provided. The optical coupling connector is configured to connect an optical fiber array and an optoelectronics chip, and includes an upper-layer connector and a lower-layer connector. The upper-layer connector includes N upper-layer waveguides, where N is a positive integer greater than or equal to 2. The lower-layer connector includes N lower-layer waveguides. The N lower-layer waveguides and the N upper-layer waveguides are coupled in a one-to-one correspondence. Each lower-layer waveguide includes a coupling waveguide portion, a pitch matching waveguide portion, and a signal light amplification waveguide portion.

20 Claims, 18 Drawing Sheets

(51) Int. Cl.

| | |
|---|---|
| *G02B 6/125* | (2006.01) |
| *H01S 3/094* | (2006.01) |
| *H01S 3/063* | (2006.01) |
| *G02B 6/42* | (2006.01) |
| *H01S 5/10* | (2006.01) |
| *H01S 5/50* | (2006.01) |
| *G02B 6/12* | (2006.01) |
| *G02B 6/30* | (2006.01) |
| *H01S 5/04* | (2006.01) |
| *H01S 5/30* | (2006.01) |
| *H01S 5/40* | (2006.01) |
| *H01S 3/16* | (2006.01) |
| *H01S 3/23* | (2006.01) |
| *G02B 6/122* | (2006.01) |

(52) U.S. Cl.
CPC .......... *G02B 6/4249* (2013.01); *H01S 3/0637* (2013.01); *H01S 3/094057* (2013.01); *H01S 5/041* (2013.01); *H01S 5/1032* (2013.01); *H01S 5/3013* (2013.01); *H01S 5/50* (2013.01); *G02B 6/1228* (2013.01); *G02B 6/305* (2013.01); *G02B 2006/12147* (2013.01); *H01S 3/094053* (2013.01); *H01S 3/094061* (2013.01); *H01S 3/1608* (2013.01); *H01S 3/1618* (2013.01); *H01S 3/2383* (2013.01); *H01S 5/1014* (2013.01); *H01S 5/4031* (2013.01)

(58) Field of Classification Search
CPC .... H01S 3/2383; H01S 3/094061; H01S 5/22; H01S 5/041; H01S 5/3013; H01S 5/4031; H01S 5/1014; G02B 6/125; G02B 6/4249; G02B 6/12002; G02B 6/30; G02B 6/1228; G02B 2006/12147
USPC .......................................... 359/341.1; 385/49
See application file for complete search history.

(56) References Cited

U.S. PATENT DOCUMENTS

| | | | |
|---|---|---|---|
| 6,594,420 B1 * | 7/2003 | Lange | H01S 3/06754 385/129 |
| 6,873,722 B2 * | 3/2005 | Hercke | G01B 21/30 356/237.2 |
| 6,954,564 B2 | 10/2005 | Bendett | |
| 7,643,710 B1 | 1/2010 | Liu | |
| 7,826,702 B2 | 10/2010 | Dawes | |
| 2002/0021486 A1 | 2/2002 | Lange et al. | |
| 2002/0186949 A1 | 12/2002 | Gao | |
| 2004/0028336 A1 | 2/2004 | Fire et al. | |
| 2004/0081415 A1 | 4/2004 | Demaray et al. | |
| 2006/0126987 A1 | 6/2006 | Kang et al. | |
| 2010/0040327 A1 | 2/2010 | Deki et al. | |
| 2010/0142900 A1 | 6/2010 | Uchida et al. | |

FOREIGN PATENT DOCUMENTS

| | | |
|---|---|---|
| CN | 102902024 A | 1/2013 |
| JP | 2010128109 A | 6/2010 |
| WO | 2015063628 A1 | 5/2015 |

OTHER PUBLICATIONS

Russell A. Budd et al, Semiconductor optical amplifier (SOA) packaging for scalable and gain-integrated silicon photonic switching platforms. 2015 IEEE 65th Electronic Components and Technology Conference (ECTC), Jul. 16, 2015, 7 pages.

P. Kaspar et al, Packaged Hybrid III-V/silicon SOA. ECOC 2014, Cannes—France, 3 pages.

Wang Xiaoxia et al, High Gain Submicrometer Optical Amplifier at Near-Infrared Communication Band. Physical Review Letters, Jul. 10, 2015, 7 pages.

Jonathan D. B. Bradley et al, 170 Gbit/s transmission in an erbium-doped waveguide amplifier on silicon. Nov. 23, 2009 / vol. 17, No. 24 / Optics Express 22201, 8 pages.

* cited by examiner

OPTICAL COUPLING CONNECTOR, OPTICAL COUPLING SYSTEM, AND WAVEGUIDE COUPLING METHOD

CROSS-REFERENCE TO RELATED APPLICATIONS

This application is a continuation of International Application No. PCT/CN2017/071703, filed on Jan. 19, 2017, which claims priority to Chinese Patent Application No. 201610131683.3, filed on Mar. 9, 2016. The disclosures of the aforementioned applications are hereby incorporated by reference in their entireties.

TECHNICAL FIELD

This application relates to the field of communications technologies, and in particular, to an optical coupling connector, an optical coupling system, and a waveguide coupling method.

BACKGROUND

In the optical communications field, an optical fiber is used to transmit signal light, and an optoelectronics chip is used to, for example, modulate, route, and multiplex received signal light. To obtain a greater optical communication capacity, an optical fiber array (which includes a plurality of optical fibers) is usually used to transmit signal light. A pitch between adjacent optical fibers in the optical fiber array is relatively large due to reasons such as a manufacturing technique. However, a pitch between adjacent optical waveguides in an optoelectronics chip (which includes a plurality of optical waveguides) is relatively small. As a result, the optical fibers in the optical fiber array cannot be connected to the optical waveguides in the optoelectronics chip. To couple signal light in the optical fiber array to the optoelectronics chip, an optical coupling connector usually needs to be used.

The optical coupling connector is used to connect the optical fiber array and the optoelectronics chip, to input, into the optoelectronics chip, signal light transmitted by the optical fiber array. However, losses of the signal light occur when the signal light is transmitted in an optical fiber and the optical coupling connector due to causes such as absorption and scattering. There are two commonly used solutions at present for compensating for the losses of the signal light. In a first solution, an erbium-doped optical fiber amplifier (EDFA) is used instead of the optical coupling connector. The EDFA is connected between the optical fiber array and the optoelectronics chip, to amplify and couple the signal light. A disadvantage of the first solution is as follows: Because a volume of the EDFA is relatively large and each optical fiber needs to independently use one EDFA, when a quantity of optical fibers in the optical fiber array is relatively large, a coupling difficulty when EDFAs are used is relatively great. In a second solution, a semiconductor optical amplifier (SOA) is integrated into the optoelectronics chip, and the signal light received by the optoelectronics chip is amplified by using the SOA. A disadvantage of the second solution is as follows: Because a thermal effect of the SOA is obvious, a temperature controller needs to be installed in the optoelectronics chip. In addition, because a preparation technique of the SOA is incompatible with a technique of a complementary metal oxide semiconductor (CMOS) in the optoelectronics chip, integrating the SOA into the optoelectronics chip encounters a relatively great technical difficulty.

SUMMARY

Embodiments of this application disclose an optical coupling connector, an optical coupling system, and an optical coupling method, which can be used to resolve a problem that an optical coupling connector preparation technique is complex.

A first aspect of the embodiments of this application provides an optical coupling connector, configured to connect an optical fiber array and an optoelectronics chip, and includes an upper-layer connector and a lower-layer connector, where the upper-layer connector includes N upper-layer waveguides, where N is a positive integer greater than or equal to 2; the lower-layer connector includes N lower-layer waveguides, where the N lower-layer waveguides and the N upper-layer waveguides are coupled in a one-to-one correspondence, and each lower-layer waveguide includes a coupling waveguide portion, a pitch matching waveguide portion, and a signal light amplification waveguide portion; a pump light source is connected to the N upper-layer waveguides, where the pump light source provides N channels of pump light for the N upper-layer waveguides; the optical fiber array includes N optical fibers, where the N optical fibers provide N channels of signal light for the N lower-layer waveguides; the optoelectronics chip includes N optical waveguides, where first ends of the N lower-layer waveguides are connected to the N optical fibers in a one-to-one correspondence, and second ends of the N lower-layer waveguides are connected to the N optical waveguides in a one-to-one correspondence; and the N upper-layer waveguides couple the N channels of pump light to the corresponding N lower-layer waveguides one to one; and each lower-layer waveguide includes a first core layer and a first covering layer that covers the first core layer, where a material of the first covering layer includes a gain material, the gain material to transfer energy of the pump light to the signal light, and a refractive index of the first core layer is greater than a refractive index of the first covering layer.

A second aspect of the embodiments of this application discloses an optical coupling connector, including an upper-layer connector and a lower-layer connector, where the upper-layer connector includes N upper-layer amplification waveguides, where N is a positive integer greater than or equal to 2; the lower-layer connector includes N lower-layer waveguides, where the N lower-layer waveguides and the N upper-layer amplification waveguides are coupled in a one-to-one correspondence, and each lower-layer waveguide includes a first coupling waveguide portion, a second coupling waveguide portion, and a pitch matching waveguide portion; an optical fiber array includes N optical fibers, where the N optical fibers provide N channels of signal light for the N lower-layer waveguides; and an optoelectronics chip includes N optical waveguides, where first ends of the N lower-layer waveguides are connected to the N optical fibers in a one-to-one correspondence, and second ends of the N lower-layer waveguides are connected to the N optical waveguides in a one-to-one correspondence;

each upper-layer amplification waveguide includes a first core layer and a first covering layer that covers the first core layer, where a material of the first core layer includes a gain material, the gain material to amplify signal light that is coupled to a corresponding upper-layer amplification waveguide by a lower-layer waveguide, and a refractive index of the first core layer is greater than a refractive index of the first covering layer; and each lower-layer waveguide includes a second core layer and a second covering layer that covers the second core layer, where the second core layer is configured to transmit the signal light, and a refractive index of the second core layer is greater than a refractive index of the second covering layer.

A third aspect of the embodiments of this application discloses an optical coupling system, including an optical fiber array, an optoelectronics chip, at least one laser, and any optical coupling connector disclosed in the first aspect of the embodiments of this application, where the optical fiber array includes N optical fibers, the optoelectronics chip includes N optical waveguides, the optical coupling connector includes N upper-layer waveguides and N lower-layer waveguides, the N lower-layer waveguides and the N upper-layer waveguides are coupled in a one-to-one correspondence, the N optical fibers of the optical fiber array and the N lower-layer waveguides of the optical coupling connector are connected in a one-to-one correspondence, the N lower-layer waveguides of the optical coupling connector and the N optical waveguides of the optoelectronics chip are connected in a one-to-one correspondence, and the at least one laser is connected to the N upper-layer waveguides; and the at least one laser outputs N channels of pump light to the N upper-layer waveguides, the N optical fibers output N channels of signal light to the N lower-layer waveguides, the optical coupling connector couples the N channels of pump light respectively to the N lower-layer waveguides, and the N lower-layer waveguides respectively couple the N channels of pump light to the N channels of signal light and amplify coupled light, and respectively output the amplified coupled light to the N optical waveguides of the optoelectronics chip.

A fourth aspect of the embodiments of this application discloses a waveguide coupling method, applied to any optical coupling connector disclosed in the first aspect of the embodiments of this application, and including:

receiving, by the optical coupling connector, N channels of signal light output by an optical fiber array, and receiving N channels of pump light input by a pump light source, where N is a positive integer greater than or equal to 2;

coupling, by the optical coupling connector, the N channels of signal light and the N channels of pump light in a one-to-one correspondence, to form N channels of coupled light; and amplifying, by the optical coupling connector, signal light in each channel of coupled light, attenuating pump light in each channel of coupled light, and transmitting the amplified signal light in each channel of coupled light to an optoelectronics chip.

A fifth aspect of the embodiments of this application discloses an optical coupling system, including an optical fiber array, an optoelectronics chip, and any optical coupling connector disclosed in the second aspect of the embodiments of this application, where the optical fiber array includes N optical fibers, the optoelectronics chip includes N optical waveguides, the optical coupling connector includes N upper-layer amplification waveguides and N lower-layer waveguides, the N lower-layer waveguides and the N upper-layer amplification waveguides are coupled in a one-to-one correspondence, the N optical fibers of the optical fiber array and the N lower-layer waveguides of the optical coupling connector are connected in a one-to-one correspondence, and the N lower-layer waveguides of the optical coupling connector and the N optical waveguides of the optoelectronics chip are connected in a one-to-one correspondence; and the N optical fibers of the optical fiber array output N channels of signal light to the N lower-layer waveguides of the optical coupling connector, the N lower-layer waveguides respectively couple the N channels of signal light to the N upper-layer amplification waveguides of the optical coupling connector, the N upper-layer amplification waveguides respectively amplify the N channels of signal light and couple the N channels of amplified signal light to the N lower-layer waveguides, and the N lower-layer waveguides respectively output the N channels of amplified signal light to the N optical waveguides of the optoelectronics chip.

A sixth aspect of the embodiments of this application discloses a waveguide coupling method, applied to any optical coupling connector disclosed in the second aspect of the embodiments of this application, and including:

receiving, by a lower-layer connector, N channels of signal light output by an optical fiber array;

coupling, by the lower-layer connector, the N channels of signal light to an upper-layer connector in a one-to-one correspondence; and separately amplifying, by the upper-layer connector, the N channels of signal light and then coupling the N channels of amplified signal light to the lower-layer connector; and outputting, by the lower-layer connector, the N channels of amplified signal light respectively to N optical waveguides of an optoelectronics chip.

BRIEF DESCRIPTION OF DRAWINGS

To describe the technical solutions in the embodiments of this application more clearly, the following briefly describes the accompanying drawings required in the embodiments. Apparently, the accompanying drawings in the following description show merely some embodiments of this application, and persons of ordinary skill in the art may still derive other drawings from these accompanying drawings without creative efforts.

DESCRIPTION OF EMBODIMENTS

The following clearly describes the technical solutions in the embodiments of this application with reference to the accompanying drawings in the embodiments of this application. Apparently, the described embodiments are some but not all of the embodiments of this application. All other embodiments obtained by persons of ordinary skill in the art based on the embodiments of this application without creative efforts shall fall within the protection scope of this application.

The embodiments of this application disclose an optical coupling connector, an optical coupling system, and an optical coupling method, which can be used to resolve a problem that an optical coupling connector preparation technique is complex, and are separately described in detail below.

To facilitate better understanding of the embodiments of this application, the following first describes a system architecture disclosed in the embodiments of this application.

Figure 1A:
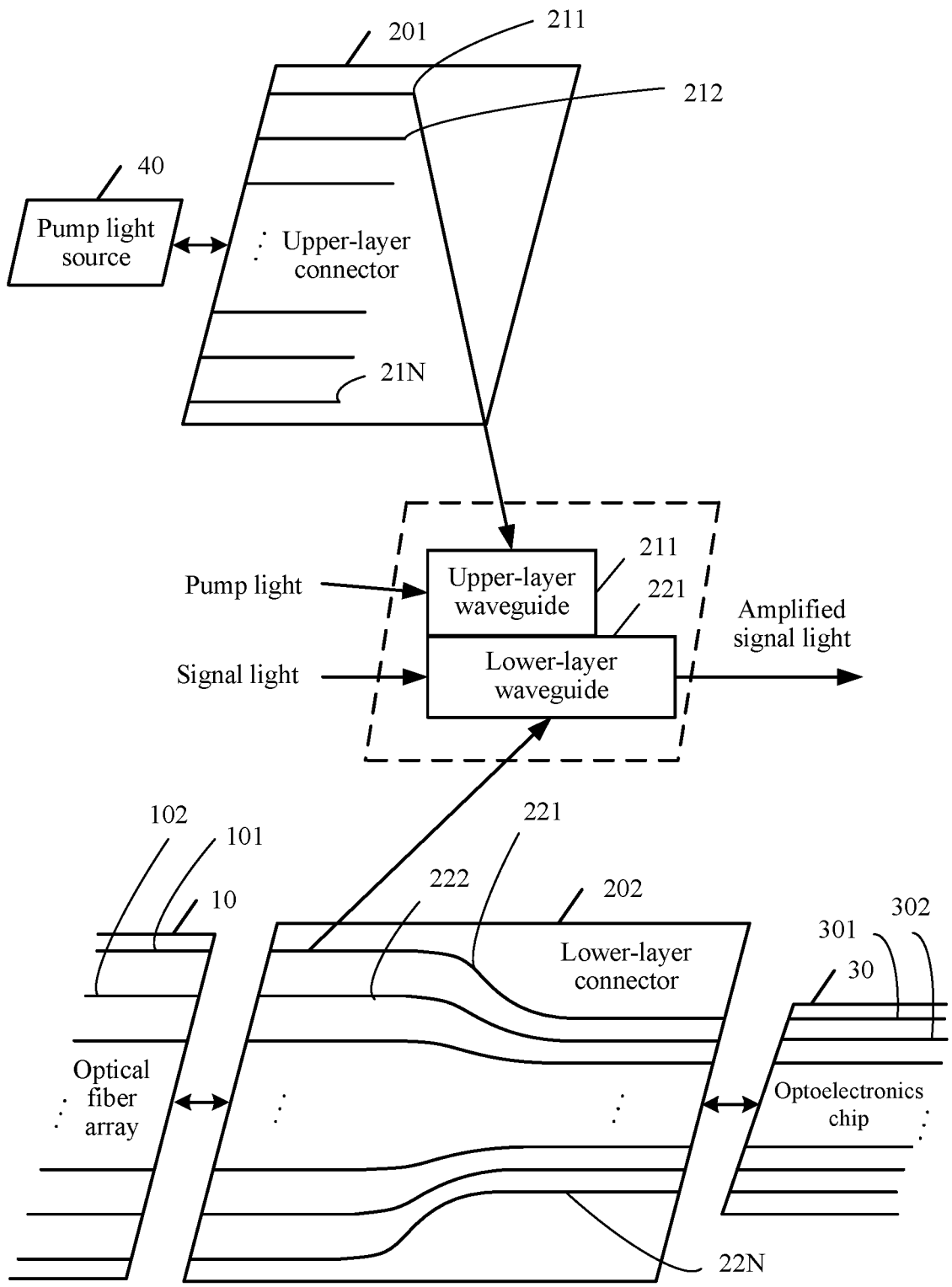
FIG. 1*a* is a schematic diagram of a system architecture disclosed in an embodiment of this application.

Referring to FIG. 1a, FIG. 1a is a schematic diagram of a system architecture disclosed in an embodiment of this application. As shown in FIG. 1a, the system architecture includes an optical fiber array 10, an optical coupling connector 20, an optoelectronics chip 30, and a pump light source 40. The optical fiber array 10 includes N optical fibers (101, 102, . . . ). The optical coupling connector 20 may include an upper-layer connector 201 and a lower-layer connector 202. The upper-layer connector 201 includes N upper-layer waveguides (211, 212, . . . ), the lower-layer connector includes N lower-layer waveguides (221, 222, . . . ), and the optoelectronics chip includes N optical waveguides (301, 302, . . . ). A waveguide is an apparatus for transmitting an electromagnetic wave. Each waveguide may independently transmit one channel of electromagnetic wave signal. A shape of the waveguide may be a rectangle, a circle, or the like. A material of the waveguide may be a material that causes a relatively small transmission loss to the electromagnetic wave, for example, silicon dioxide that causes a relatively small transmission loss to an optical signal.

Figure 1B:
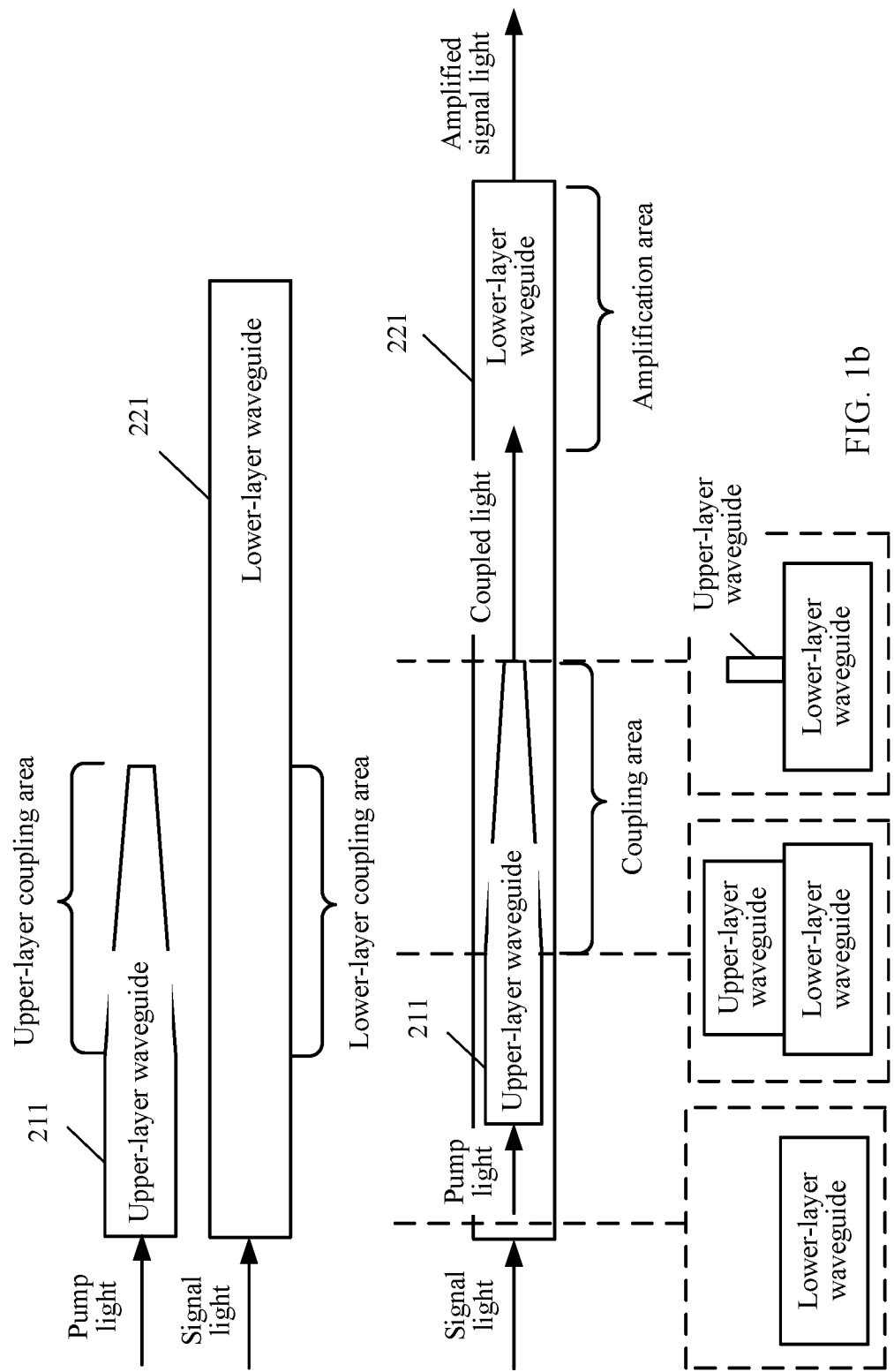
FIG. 1*b* is a schematic diagram of a coupled connection between an upper-layer waveguide and a lower-layer waveguide disclosed in an embodiment of this application.

One optical fiber (for example, an optical fiber 101) in the optical fiber array 10 is connected to one end of one lower-layer waveguide (for example, a lower-layer waveguide 221), and the other end of the one lower-layer waveguide (for example, the lower-layer waveguide 221) is connected to one optical waveguide (for example, an optical waveguide 301) in the optoelectronics chip 30. One upper-layer waveguide (211) is located at an upper layer of the one lower-layer waveguide (for example, the lower-layer waveguide 221), as shown in the dashed box part (which is an enlarged diagram of a connection relationship between the upper-layer waveguide 211 and the corresponding lower-layer waveguide 221) in FIG. 1a. Each optical fiber is connected to a unique lower-layer waveguide (in other words, one optical fiber is correspondingly connected to one lower-layer waveguide; for example, the optical fiber 101 is correspondingly connected to the lower-layer waveguide 221). Each lower-layer waveguide is connected to a unique optical waveguide (in other words, one lower-layer waveguide is correspondingly connected to one optical waveguide; for example, the lower-layer waveguide 221 is correspondingly connected to the optical waveguide 301). One upper-layer waveguide and one lower-layer waveguide are correspondingly coupled (for example, the upper-layer waveguide 211 and the lower-layer waveguide 221 are correspondingly coupled). A coupling manner between the upper-layer waveguide 211 and the lower-layer waveguide 221 may be a vertical coupling manner. As shown in FIG. 1b, FIG. 1b is a schematic diagram of a coupled connection between an upper-layer waveguide and a lower-layer waveguide disclosed in an embodiment of this application. In FIG. 1b, rectangular waveguides are used as an example. An upper-layer coupling area of an upper-layer waveguide 211 and a lower-layer coupling area of a lower-layer waveguide 221 are coupled, so that pump light is coupled from the upper-layer coupling area of the upper-layer waveguide 211 to the lower-layer coupling area of the lower-layer waveguide 221. When the pump light enters the upper-layer coupling area of the upper-layer waveguide 211, because a width of the upper-layer coupling area gradually narrows down in a transmission direction of the pump light, the upper-layer waveguide 211 cannot restrict the pump light inside the upper-layer coupling area, and the pump light continuously escapes from the upper-layer coupling area and enters the lower-layer coupling area of the lower-layer waveguide 221. The lower-layer waveguide 221 continuously collects the pump light escaped from the upper-layer waveguide 221, thereby gradually coupling the pump light from the upper-layer waveguide 211 to the lower-layer waveguide 221.

The pump light source 40 provides N channels of pump light for the N upper-layer waveguides (211, 212, . . . ). The pump light source 40 may be a laser (for example, a semiconductor laser), a light-emitting diode, or the like. Each upper-layer waveguide receives one channel of pump light. The N optical fibers (101, 102, . . . ) in the optical fiber array 10 provide N channels of signal light for the N lower-layer waveguides (221, 222, . . . ). Each lower-layer waveguide receives one channel of signal light. The N upper-layer waveguides respectively couple the N channels of pump light to the N lower-layer waveguides. Each upper-layer waveguide couples the received pump light to a corresponding lower-layer waveguide. For any lowerwaveguide of the N lower-layer waveguides, the any lower-layer waveguide couples the received signal light to the pump light, attenuates the pump light, amplifies the signal light, and outputs the amplified signal light to the optoelectronics chip 30.

When the system architecture shown in FIG. 1a is implemented, the optical coupling connector 20 can amplify a plurality of channels of signal light in the optical fiber array 10 and output the amplified signal light to the optoelectronics chip 30. The optical coupling connector 20 not only can couple the optical fiber array 10 and the optoelectronics chip 30, and can also amplify the signal light in the optical coupling connector 20. This resolves a problem of an excessive signal light loss in the optical coupling connector 20.

Figure 1C:
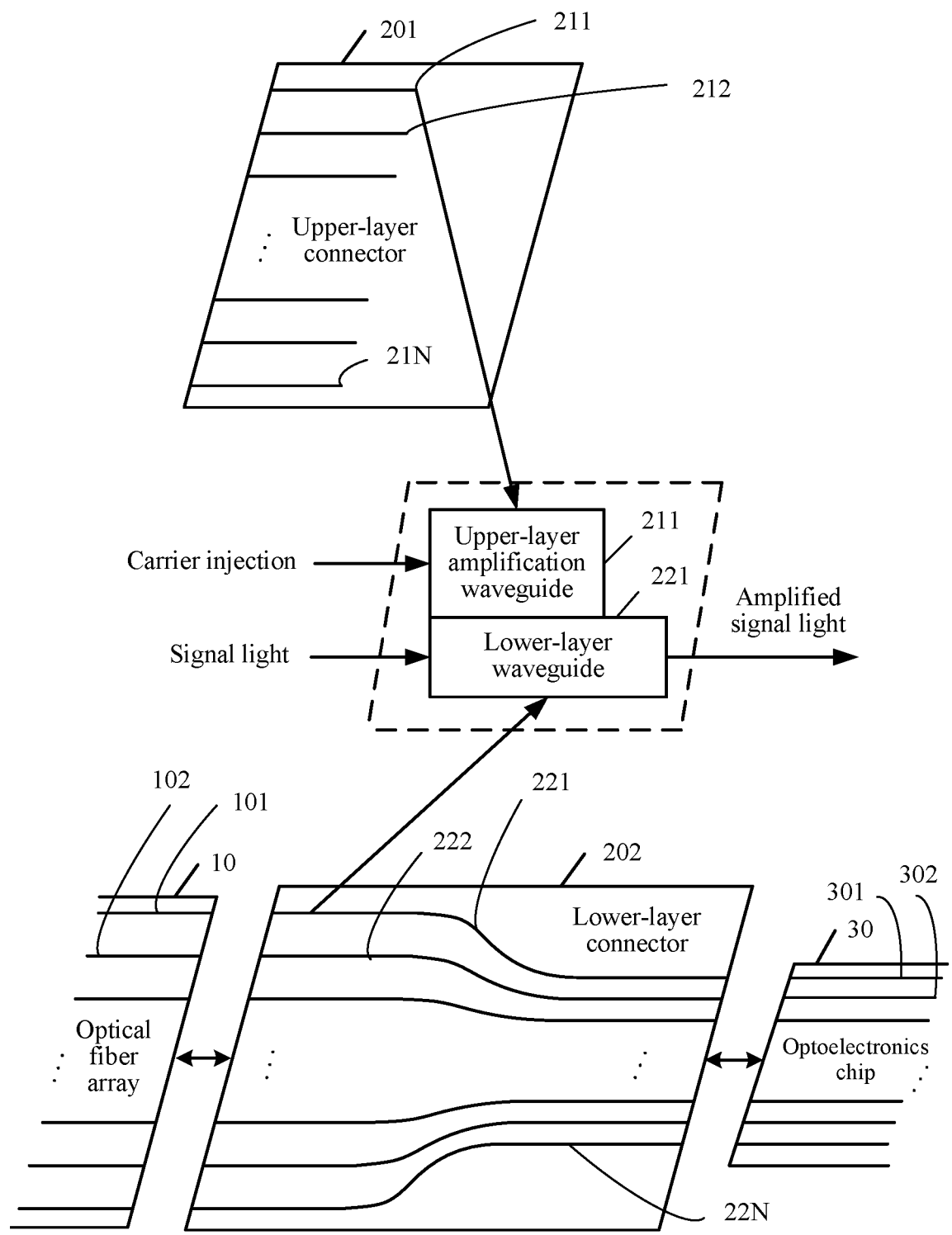
FIG. 1*c* is a schematic diagram of another system architecture disclosed in an embodiment of this application.

Referring to FIG. 1c, FIG. 1c is a schematic diagram of another system architecture disclosed in an embodiment of this application. As shown in FIG. 1c, the system architecture includes an optical fiber array 10, an optical coupling connector 20, and an optoelectronics chip 30. The optical fiber array 10 includes N optical fibers (101, 102, . . . ). The optical coupling connector 20 may include an upper-layer connector 201 and a lower-layer connector 202. The upper-layer connector 201 includes N upper-layer amplification waveguides (211, 212, . . . ), the lower-layer connector includes N lower-layer waveguides (221, 222, . . . ), and the optoelectronics chip includes N optical waveguides (301, 302, . . . ). A waveguide is an apparatus for transmitting an electromagnetic wave. Each waveguide may independently transmit one channel of electromagnetic wave signal. A shape of the waveguide may be a rectangle, a circle, or the like. A core-layer material of the N lower-layer waveguides may be a material that causes a relatively small transmission loss to the electromagnetic wave, for example, silicon dioxide ($SiO_2$) that causes a relatively small transmission loss to an optical signal. A core-layer material of the N upper-layer amplification waveguides may be a semiconductor material, and optionally, is a direct band-gap semiconductor material, for example, gallium arsenide (GaAs) or indium phosphide (InP).

Figure 1D:
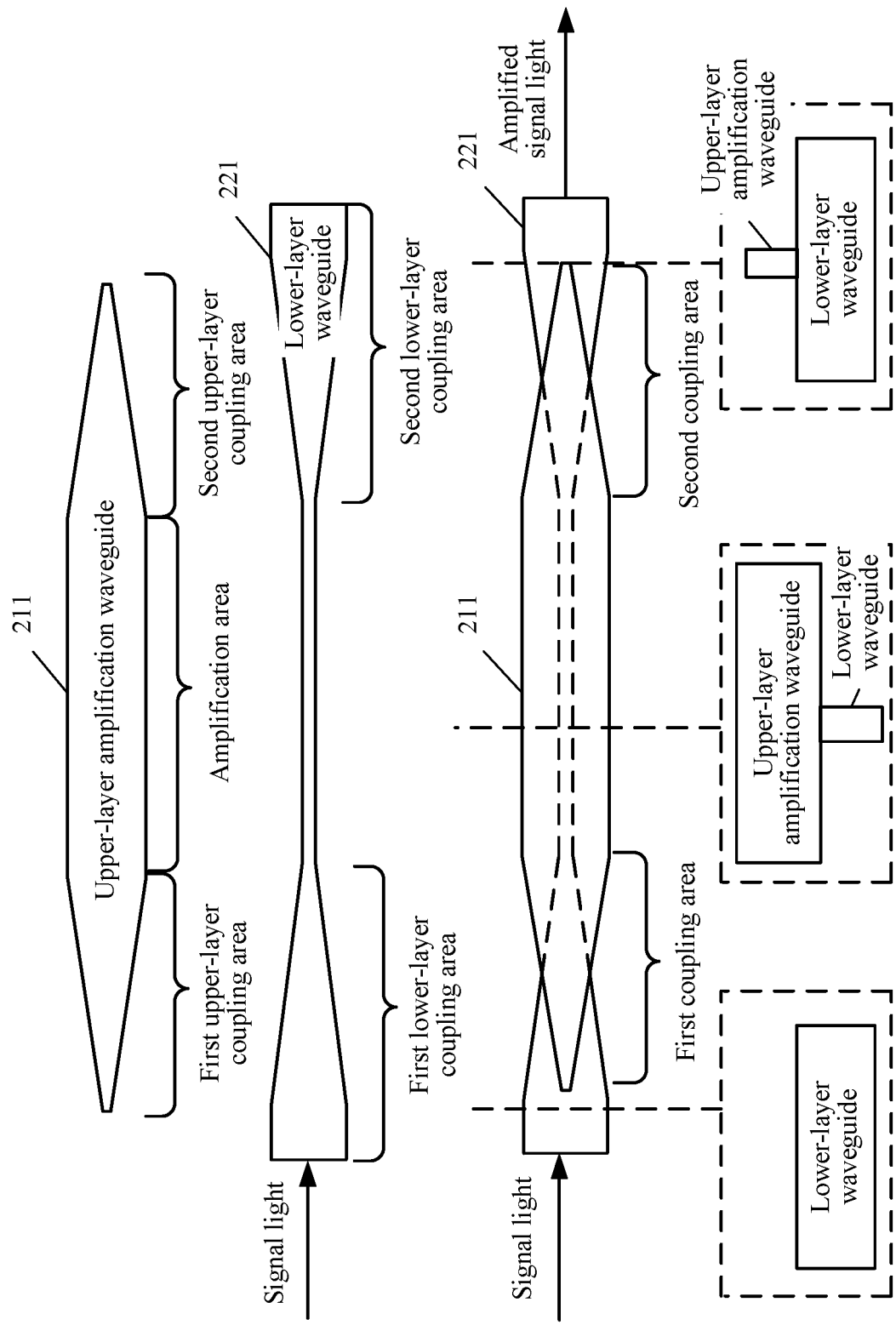
FIG. 1*d* is a schematic diagram of a coupled connection between an upper-layer amplification waveguide and a lower-layer waveguide disclosed in an embodiment of this application.

One optical fiber (for example, an optical fiber 101) in the optical fiber array 10 is connected to one end of one lower-layer waveguide (for example, a lower-layer waveguide 221), and the other end of the one lower-layer waveguide (for example, the lower-layer waveguide 221) is connected to one optical waveguide (for example, an optical waveguide 301) in the optoelectronics chip 30. One upper-layer amplification waveguide (211) is located at an upper layer of the one lower-layer waveguide (for example, the lower-layer waveguide 221), as shown in the dashed box part (which is an enlarged diagram of a connection relationship between the upper-layer amplification waveguide 211 and the corresponding lower-layer waveguide 221) in FIG. 1c. Each optical fiber is connected to a unique lower-layer waveguide (in other words, one optical fiber is correspondingly connected to one lower-layer waveguide; for example, the optical fiber 101 is correspondingly connected to the lower-layer waveguide 221). Each lower-layer waveguide is connected to a unique optical waveguide (in other words, one lower-layer waveguide is correspondingly connected to one optical waveguide; for example, the lower-layer waveguide 221 is correspondingly connected to the optical waveguide 301). One upper-layer amplification waveguide and one lower-layer waveguide are correspondingly coupled (for example, the upper-layer amplification waveguide 211 and the lower-layer waveguide 221 are correspondingly coupled). A coupling manner between the upper-layer amplification waveguide 211 and the lower-layer waveguide 221 may be a vertical coupling manner. As shown in FIG. 1d, FIG. 1d is a schematic diagram of a coupled connection between an upper-layer amplification waveguide and a lower-layer waveguide disclosed in an embodiment of this application. In FIG. 1d, rectangular waveguides are used as an example. An upper-layer coupling area (including a first upper-layer coupling area and a second upper-layer coupling area) of an upper-layer amplification waveguide 211 and a lower-layer coupling area (including a first lower-layer coupling area and a second lower-layer coupling area) of a lower-layer waveguide 221 are coupled, so that signal light is coupled from the first lower-layer coupling area of the lower-layer waveguide 221 to the first upper-layer coupling area of the upper-layer amplification waveguide 211. After being amplified by an amplification area of the upper-layer amplification waveguide 211, the signal light is coupled from the second upper-layer coupling area to the second lower-layer coupling area of the lower-layer waveguide 221. When the signal light enters the first upper-layer coupling area of the upper-layer amplification waveguide 211 from the first lower-layer coupling area of the lower-layer waveguide 221, because in a transmission direction of the signal light, a width of the first lower-layer coupling area gradually narrows down and a width of the first upper-layer coupling area gradually broadens, the lower-layer waveguide 221 cannot restrict the signal light inside the first lower-layer coupling area, and the signal light continuously escapes from the first lower-layer coupling area and enters the first upper-layer coupling area of the upper-layer amplification waveguide 211. The upper-layer amplification waveguide 211 continuously collects the signal light escaped from the lower-layer waveguide 221, thereby gradually coupling the signal light from the lower-layer waveguide 221 to the upper-layer amplification waveguide 211. After the signal light enters the upper-layer amplification waveguide 211, the amplification area of the upper-layer amplification waveguide 211 amplifies the signal light. After being amplified, the signal light enters the second lower-layer coupling area of the lower-layer waveguide 221 from the second upper-layer coupling area of the upper-layer amplification waveguide 211. Similarly, because in the transmission direction of the signal light, a width of the second upper-layer coupling area gradually narrows down and a width of the second lower-layer coupling area gradually broadens, the amplified signal light continuously escapes from the second upper-layer coupling area and enters the second lower-layer coupling area of the lower-layer waveguide 221, thereby implementing amplification of the signal light by using the upper-layer amplification waveguide.

When the system architecture shown in FIG. 1c is implemented, the optical coupling connector 20 can amplify a plurality of channels of signal light in the optical fiber array 10 and output the amplified signal light to the optoelectronics chip 30. The optical coupling connector 20 not only can couple the optical fiber array 10 and the optoelectronics chip 30, and can also amplify the signal light in the optical coupling connector 20. This resolves a problem of an excessive signal light loss in the optical coupling connector 20. The optical coupling connector in this embodiment of this application is an optical coupling connector that can amplify the signal light.

Figure 2A:
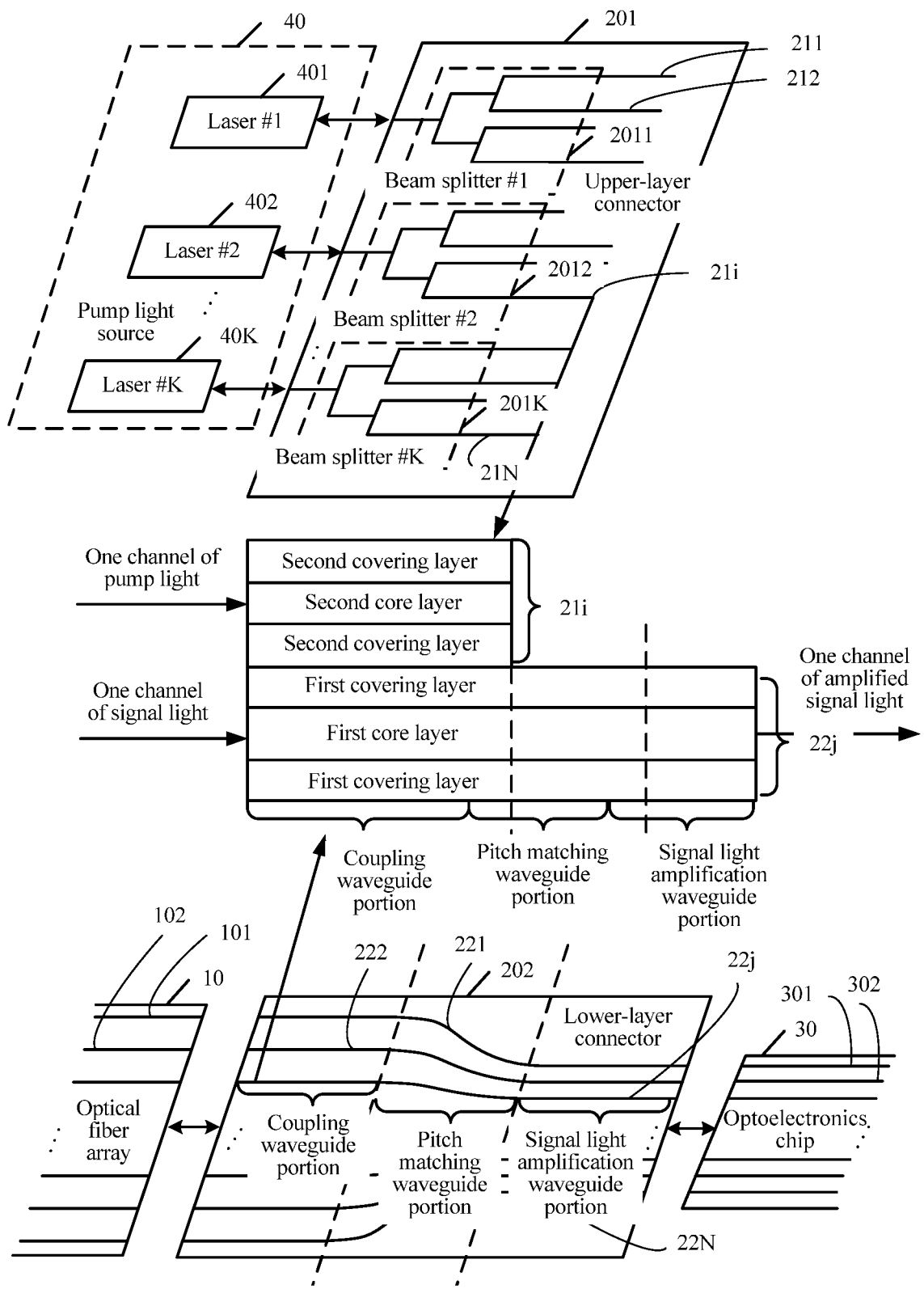
FIG. 2*a* is a schematic structural diagram of an optical coupling connector disclosed in an embodiment of this application.

Based on the system architecture shown in FIG. 1a, an optical coupling connector is disclosed. Referring to FIG. 2a, FIG. 2a is a schematic structural diagram of an optical coupling connector disclosed in an embodiment of this application. The optical coupling connector 20 is configured to connect an optical fiber array 10 and an optoelectronics chip 30. The optical coupling connector 20 includes an upper-layer connector 201 and a lower-layer connector 202.

Figure 2B:
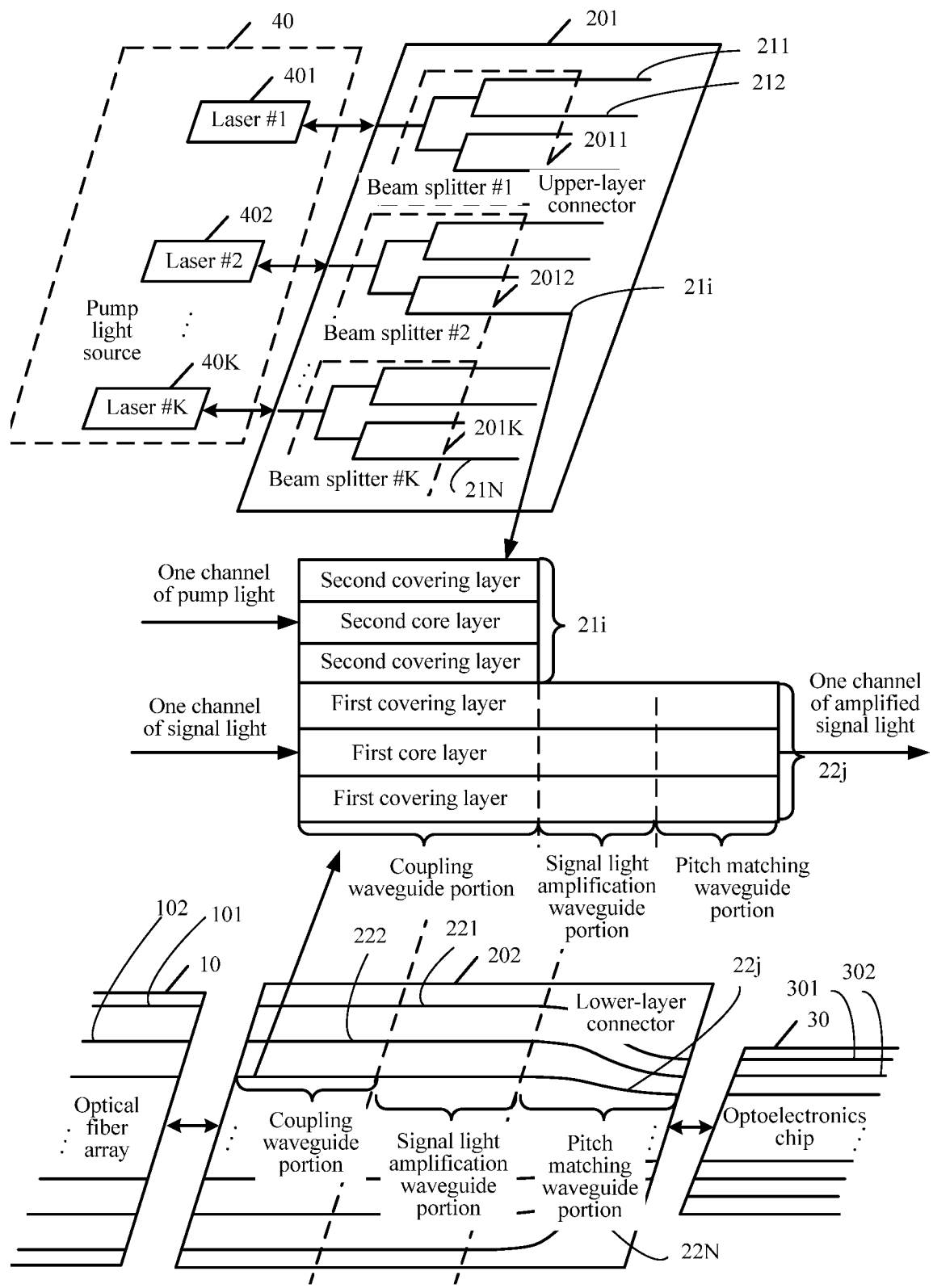
FIG. 2*b* is a schematic structural diagram of another optical coupling connector disclosed in an embodiment of this application.
Figure 2C:
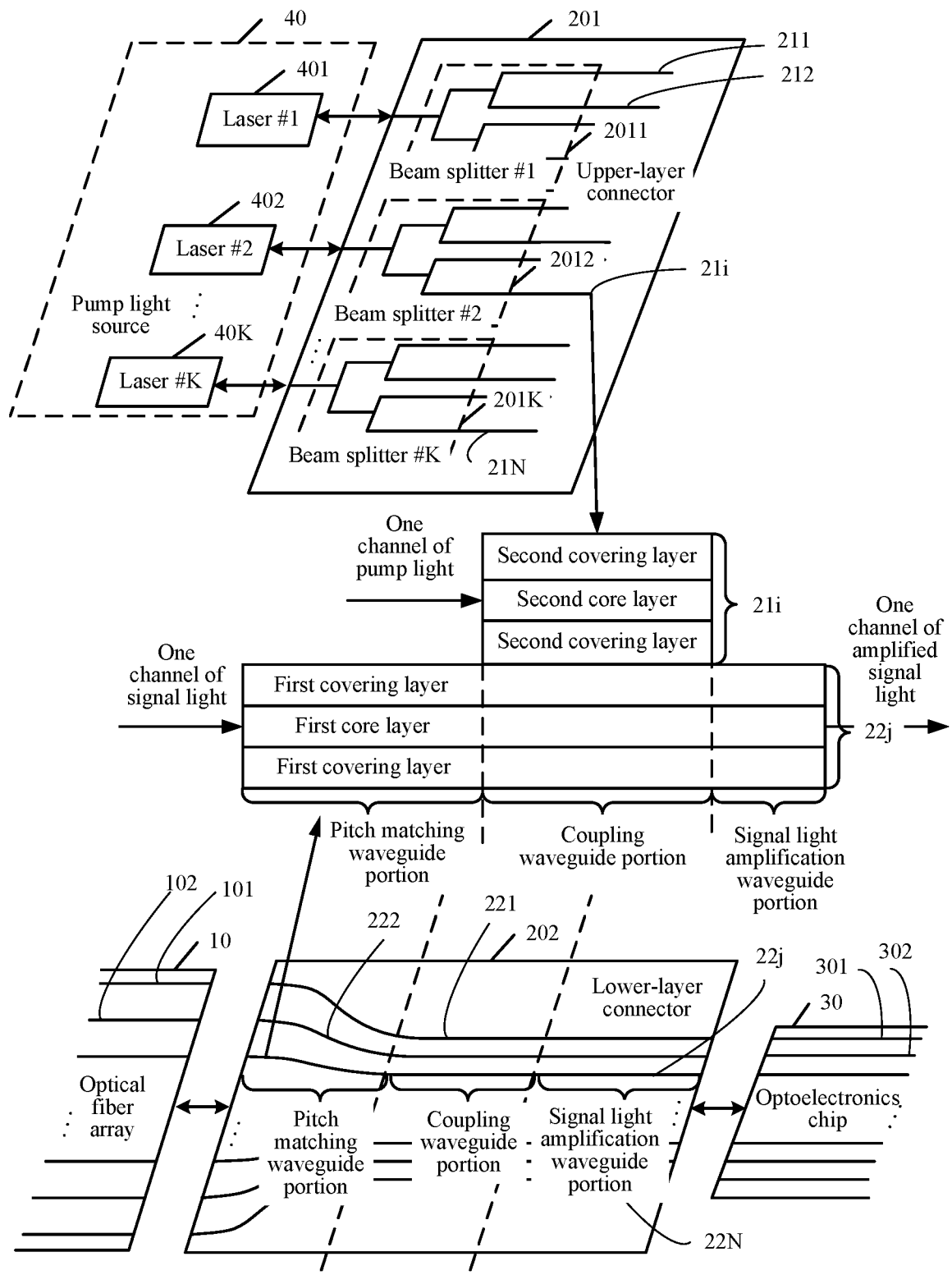
FIG. 2*c* is a schematic structural diagram of another optical coupling connector disclosed in an embodiment of this application.

The upper-layer connector 201 includes N upper-layer waveguides, where N is a positive integer greater than or equal to 2. The lower-layer connector 202 includes N lower-layer waveguides. The N lower-layer waveguides and the N upper-layer waveguides are coupled in a one-to-one correspondence. Each lower-layer waveguide includes a coupling waveguide portion, a pitch matching waveguide portion, and a signal light amplification waveguide portion. A pump light source 40 is connected to the N upper-layer waveguides (for example, 211, 212, . . . in FIG. 2a). The pump light source 40 provides N channels of pump light for the N upper-layer waveguides. The optical fiber array includes N optical fibers (for example, 101, 102, . . . in FIG. 2a). The N optical fibers provide N channels of signal light for the N lower-layer waveguides (for example, 221, 222, . . . in FIG. 2a). The optoelectronics chip includes N optical waveguides (for example, 301, 302, . . . in FIG. 2a), where first ends of the N lower-layer waveguides are connected to the N optical fibers in a one-to-one correspondence, and second ends of the N lower-layer waveguides are connected to the N optical waveguides in a one-to-one correspondence. For example, as shown in FIG. 2a, the coupling waveguide portion, the pitch matching waveguide portion, and the signal light amplification waveguide portion are connected in sequence; the N optical fibers and the N lower-layer waveguides are connected in a one-to-one correspondence at an end near the coupling waveguide portion; and the N optical waveguides and the N lower-layer waveguides are connected in a one-to-one correspondence at an end near the signal light amplification waveguide portion. Alternatively, as shown in FIG. 2b, the coupling waveguide portion, the signal light amplification waveguide portion, and the pitch matching waveguide portion are connected in sequence; the N optical fibers and the N lower-layer waveguides are connected in a one-to-one correspondence at an end near the coupling waveguide portion; and the N optical waveguides and the N lower-layer waveguides are connected in a one-to-one correspondence at an end near the pitch matching waveguide portion. Alternatively, as shown in FIG. 2c, the pitch matching waveguide portion, the coupling waveguide portion, and the signal light amplification waveguide portion are connected in sequence; the N optical fibers and the N lower-layer waveguides are connected in a one-to-one correspondence at an end near the pitch matching waveguide portion; and the N optical waveguides and the N lower-layer waveguides are connected in a one-to-one correspondence at an end near the signal light amplification waveguide portion.

Each lower-layer waveguide includes a first core layer and a first covering layer. A material of the first covering layer includes a gain material, the gain material can transfer energy of the pump light to the signal light, and a refractive index of the first core layer is greater than a refractive index of the first covering layer.

The gain material can transfer the energy of the pump light to the signal light when being excited by the pump light, implementing a function of amplifying the signal light. The refractive index of the first core layer being greater than the refractive index of the first covering layer ensures that a total reflection condition can be met when the signal light is transmitted in the first core layer of the lower-layer waveguide and that the signal light is restricted inside the core layer, reducing a transmission loss of the signal light. A material of the first core layer may be silicon, silicon dioxide, silicon nitride, a polymer, or the like. The gain material may be a material doped with rare-earth ions such as erbium ion and ytterbium ion. Optionally, a gain material used in covering layers of the coupling waveguide portion and the pitch matching waveguide portion of each lower-layer waveguide has a relatively small gain effect, and a gain material used in a covering layer of the signal light amplification waveguide portion of each lower-layer waveguide has a relatively large gain effect.

In this embodiment of this application, the upper-layer connector 201 outputs the N channels of pump light generated by the pump light source 40 respectively to the N upper-layer waveguides. The N upper-layer waveguides respectively couple the N channels of pump light to the corresponding N lower-layer waveguides. The lower-layer connector 202 couples the N channels of signal light input by the N optical fibers and the N channels of pump light in a one-to-one correspondence, to form N channels of coupled light; separately amplifies the signal light in the N channels of coupled light; and inputs the amplified signal light into the N optical waveguides of the optoelectronics chip 30 in a one-to-one correspondence. The optical coupling connector 20 shown in FIG. 2a can amplify a plurality of channels of signal light in the optical fiber array 10 and output the amplified signal light to the optoelectronics chip 30. This resolves a problem of an excessive signal light loss in the optical coupling connector 20. The optical coupling connector 20 shown in FIG. 2a has a simple structure and a small size, and uses a simple preparation technique. Therefore, preparation costs thereof are relatively low. In an embodiment, as shown in FIG. 2a, an upper-layer waveguide i (for example, 21i in FIG. 2a) receives one channel of pump light, and a lower-layer waveguide j (for example, 22j in FIG. 2a) receives one channel of signal light emitted by the optical fiber array 10. The upper-layer waveguide i couples the one channel of pump light to a coupling waveguide portion of the corresponding lower-layer waveguide j, the coupling waveguide portion of the lower-layer waveguide j transmits coupled light that includes the one channel of pump light and the one channel of signal light to a pitch matching waveguide portion of the lower-layer waveguide j, the pitch matching waveguide portion of the lower-layer waveguide j transmits the coupled light to a signal light amplification waveguide portion of the lower-layer waveguide j, and the signal light amplification waveguide portion of the lower-layer waveguide j amplifies the one channel of signal light in the coupled light, attenuates the one channel of pump light in the coupled light, and outputs the one channel of amplified signal light to the optoelectronics chip 30. The upper-layer waveguide i is any one of the N upper-layer waveguides, and the lower-layer waveguide j is any one of the N lower-layer waveguides.

Figure 3:
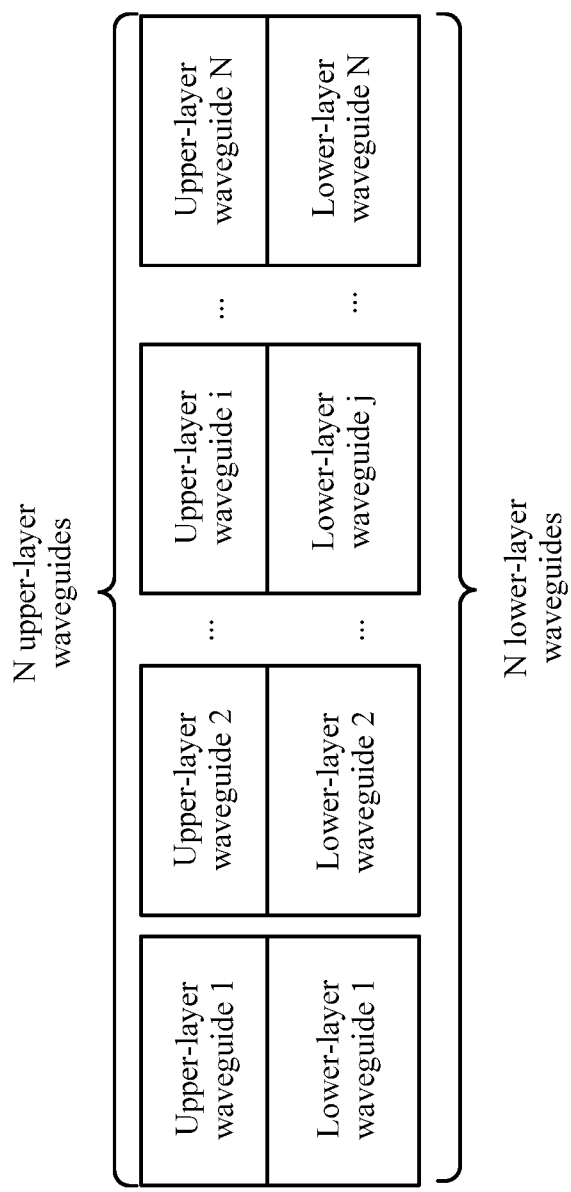
FIG. 3 is a schematic structural diagram of coupling between an upper-layer waveguide and a lower-layer waveguide disclosed in an embodiment of this application.

In this embodiment of this application, an upper-layer waveguide may be a rectangular waveguide (for example, a square waveguide), a circular waveguide, a ridge-shaped waveguide, or the like. The N upper-layer waveguides may be located on a same plane (for example, planar optical waveguides). The N lower-layer waveguides and the N upper-layer waveguides are coupled in a one-to-one correspondence. For example, as shown in FIG. 3, FIG. 3 is a schematic structural diagram of coupling between an upper-layer waveguide and a lower-layer waveguide disclosed in an embodiment of this application. In FIG. 3, rectangular waveguides are used as an example. Both a cross section of an upper-layer waveguide and a cross section of a lower-layer waveguide are rectangles. An upper-layer waveguide 1 and a lower-layer waveguide 1 are correspondingly coupled, an upper-layer waveguide 2 and a lower-layer waveguide 2 are correspondingly coupled, an upper-layer waveguide i and a lower-layer waveguide j are correspondingly coupled, and so on. There is a pitch between adjacent upper-layer waveguides, and there is a pitch between adjacent lower-layer waveguides.

The upper-layer waveguide i and the lower-layer waveguide j are used as an example to illustrate a signal light amplification principle of the optical coupling connector 20. The upper-layer waveguide i is any one of the N upper-layer waveguides, and the lower-layer waveguide j is any one of the N lower-layer waveguides. Referring to FIG. 2a, the upper-layer waveguide i (for example, 21i in FIG. 2a) in the upper-layer connector 201 receives one channel of pump light, and the lower-layer waveguide j (for example, 22j in FIG. 2a) receives one channel of signal light emitted by the optical fiber array 10. The upper-layer waveguide i couples the one channel of pump light to the coupling waveguide portion of the corresponding lower-layer waveguide j, the coupling waveguide portion of the lower-layer waveguide j transmits coupled light that includes the one channel of pump light and the one channel of signal light to the pitch matching waveguide portion of the lower-layer waveguide j, the pitch matching waveguide portion of the lower-layer waveguide j transmits the coupled light to the signal light amplification waveguide portion of the lower-layer waveguide j, and the signal light amplification waveguide portion of the lower-layer waveguide j amplifies the one channel of signal light in the coupled light, attenuates the one channel of pump light in the coupled light, and outputs the one channel of amplified signal light to the optoelectronics chip 30. The optical coupling connector 20 shown in FIG. 2a can amplify the plurality of channels of signal light in the optical fiber array 10 and output the amplified signal light to the optoelectronics chip 30. This resolves the problem of an excessive signal light loss in the optical coupling connector 20. The optical coupling connector 20 shown in FIG. 2a has a simple structure and a small size, and uses a simple preparation technique. Therefore, preparation costs thereof are relatively low.

In an embodiment, as shown in FIG. 2a, a pitch between coupling waveguide portions of any two adjacent lower-layer waveguides of the N lower-layer waveguides is equal to a pitch between any two adjacent optical fibers in the optical fiber array, and a pitch between signal light amplification waveguide portions of any two adjacent lower-layer waveguides of the N lower-layer waveguides is equal to a pitch between any two adjacent optical waveguides in the optoelectronics chip.

The pitch between the coupling waveguide portions of any two adjacent lower-layer waveguides of the N lower-layer waveguides being equal to the pitch between any two adjacent optical fibers in the optical fiber array 10 can ensure that the optical fiber array 10 is better coupled to one end (an end near the coupling waveguide portions) of the lower-layer connector 202 of the optical coupling connector 20, thereby reducing a coupling loss incurred when the signal light is transmitted from the optical fiber array 10 to the lower-layer connector 202. The pitch between the signal light amplification waveguide portions of any two adjacent lower-layer waveguides of the N lower-layer waveguides being equal to the pitch between any two adjacent optical waveguides in the optoelectronics chip 30 can ensure that the other end (an end near the signal light amplification waveguide portions) of the lower-layer connector 202 of the optical coupling connector 20 is better coupled to the optoelectronics chip 30, thereby reducing a coupling loss incurred when the signal light is transmitted from the lower-layer connector 202 to the optoelectronics chip 30. After the pitch between any two adjacent optical fibers in the optical fiber array 10 is determined, the pitch between the coupling waveguide portions of any two adjacent lower-layer waveguides of the N lower-layer waveguides is also determined subsequently. The pitch between the adjacent signal light amplification waveguide portions of any two adjacent lower-layer waveguides of the N lower-layer waveguides can be adjusted by adjusting a curvature of the pitch matching waveguide portions, so that the pitch between the adjacent signal light amplification waveguide portions of any two adjacent lower-layer waveguides of the N lower-layer waveguides is equal to the pitch between any two adjacent optical waveguides in the optoelectronics chip 30.

Optionally, a core-layer refractive index of the upper-layer waveguides is equal to a core-layer refractive index of the lower-layer waveguides, and is equal to a core-layer refractive index of the optical fibers in the optical fiber array. The core-layer refractive index of the upper-layer waveguides being equal to the core-layer refractive index of the lower-layer waveguides can improve coupling efficiency of coupling the pump light from the upper-layer waveguides to the lower-layer waveguides. The core-layer refractive index of the upper-layer waveguides being equal to the core-layer refractive index of the optical fibers in the optical fiber array can improve coupling efficiency of coupling the signal light from the optical fibers to the lower-layer waveguides.

In an embodiment, as shown in FIG. 2a, the N upper-layer waveguides and the N lower-layer waveguides are all rectangular waveguides.

In an embodiment, as shown in FIG. 2a, a core layer height and a core layer width of the first core layer meet a single-mode transmission condition.

The core layer height and the core layer width of the first core layer meet the single-mode transmission condition. In other words, the signal light is transmitted in only one mode in the lower-layer waveguides. This can reduce a transmission loss of the signal light in the lower-layer waveguides. For example, for rectangular waveguides, if the material of the first core layer is silicon and the refractive index is 3.5, the material of the first covering layer is silicon dioxide and the refractive index is 1.445, a height of the rectangular waveguides is 220 nm, a width range of the rectangular waveguides can be calculated based on a single-mode condition formula of the rectangular waveguides, and is 200-700 nm. In this case, the core layer height and the core layer width of the first core layer meet the single-mode transmission condition. For circular waveguides, signal light can meet the single-mode transmission mode by setting an incident angle of the signal light and a core layer radius.

In an embodiment, as shown in FIG. 2a, an included angle between an incident direction of one channel of pump light and a cross section of the upper-layer waveguide i is 90°, an included angle between an incident direction of one channel of signal light and a cross section of the lower-layer waveguide j is 90°, and an included angle between an emergent direction of one channel of amplified signal light and a cross section of an optical waveguide in the optoelectronics chip is 90°.

When the included angle between the incident direction of the one channel of pump light and the cross section of the upper-layer waveguide i is 90°, the one channel of pump light can be better coupled to the upper-layer waveguide i, thereby improving coupling efficiency of coupling the pump light from the pump light source to the upper-layer waveguide. When the included angle between the incident direction of the one channel of signal light and the cross section of the lower-layer waveguide j is 90°, the one channel of signal light can be better coupled to the lower-layer waveguide j, thereby improving coupling efficiency of coupling the signal light from the upper-layer waveguide to the lower-layer waveguide. When the included angle between the emergent direction of the one channel of amplified signal light and the cross section of the optical waveguide in the optoelectronics chip 30 is 90°, the one channel of amplified signal light can be better coupled to the optoelectronics chip 30, thereby improving coupling efficiency of coupling the signal light from the lower-layer waveguide to the optoelectronics chip 30.

In an embodiment, as shown in FIG. 2a, the upper-layer connector further includes at least one beam splitter, each beam splitter is configured to connect the pump light source and M upper-layer waveguides, and each beam splitter splits original pump light transmitted by the pump light source into M shares and inputs the M shares of pump light into the M upper-layer waveguides, where M is a positive integer less than or equal to N.

Each beam splitter can split the original pump light transmitted by the pump light source into M shares and inputs the M shares of pump light into the M upper-layer waveguides. The pump light source may be a laser (for example, a semiconductor laser). Optionally, a pump can split the original pump light equally into M shares and input the M shares of pump light into the M upper-layer waveguides. For example, an output power of the laser is 200 mW, and M is 4. The laser can split the power of 200 mW equally into four shares and input the four shares into the four upper-layer waveguides.

In an embodiment, as shown in FIG. 2a, each upper-layer waveguide includes a second core layer and a second covering layer that covers the second core layer. The second core layer is configured to transmit the pump light, a refractive index of the second core layer is greater than a refractive index of the second covering layer, a width of the second core layer gradually decreases along a propagation direction of the pump light, and a height of the second core layer is constant.

The refractive index of the second core layer being greater than the refractive index of the second covering layer can ensure that a full reflection condition can be met when the pump light is transmitted in the second core layer of the upper-layer waveguide. The pump light is restricted in the core layer, reducing a transmission loss of the pump light in the upper-layer waveguide. Because the width of the second core layer gradually decreases along the propagation direction of the pump light, and the height of the second core layer is constant, the pump light in the upper-layer waveguide can be rapidly coupled to the lower-layer waveguide, improving coupling efficiency of coupling the pump light from the upper-layer waveguide to the lower-layer waveguide. A material of the second core layer may be silicon, silicon dioxide, silicon nitride, a polymer, or the like. Optionally, a height of a covering layer between an upper-layer waveguide (for example, 21i in FIG. 2a) and a corresponding lower-layer waveguide (for example, 22j in FIG. 2a) is minimized, so that a loss of pump light in the covering layer can be reduced, thereby improving coupling efficiency of coupling the pump light from the upper-layer waveguide to the lower-layer waveguide.

In an embodiment, as shown in FIG. 2a, a core layer width of the signal light amplification waveguide portion is less than or equal to a core layer width of the coupling waveguide portion.

A core layer size of the optical fiber in the optical fiber array 10 is relatively large, and a core layer size of the optical waveguide in the optoelectronics chip 30 is relatively small. Therefore, for the lower-layer connector 202 in the optical coupling connector 20 to match the optical fiber array 10 and the optoelectronics chip 30, the core layer width of the coupling waveguide portion of the lower-layer waveguide in the lower-layer connector 202 matches a core layer width of the optical fiber in the optical fiber array 10, and the core layer width of the signal light amplification waveguide portion of the lower-layer waveguide in the lower-layer connector 202 matches a core-layer width of the optical waveguide in the optoelectronics chip 30, so that the optical fiber array 10 and the optoelectronics chip 30 are coupled by using the optical coupling connector 20.

In an embodiment, as shown in FIG. 2a, a core layer length of the signal light amplification waveguide portion is greater than a core layer length of the coupling waveguide portion.

In the signal light amplification waveguide portion, the pump light gradually attenuates and the signal light is gradually amplified. The pump light is weaker and the signal light is stronger as the core layer length of the signal light amplification waveguide portion increases. When the core layer length of the signal light amplification waveguide portion is greater than the core layer length of the coupling waveguide portion, the pump light can be attenuated to the greatest extent and the signal light can be amplified to the greatest extent.

In an embodiment, as shown in FIG. 2a, the gain material includes an ytterbium material, an erbium material, or a combination of an ytterbium material and an erbium material.

Figure 4:
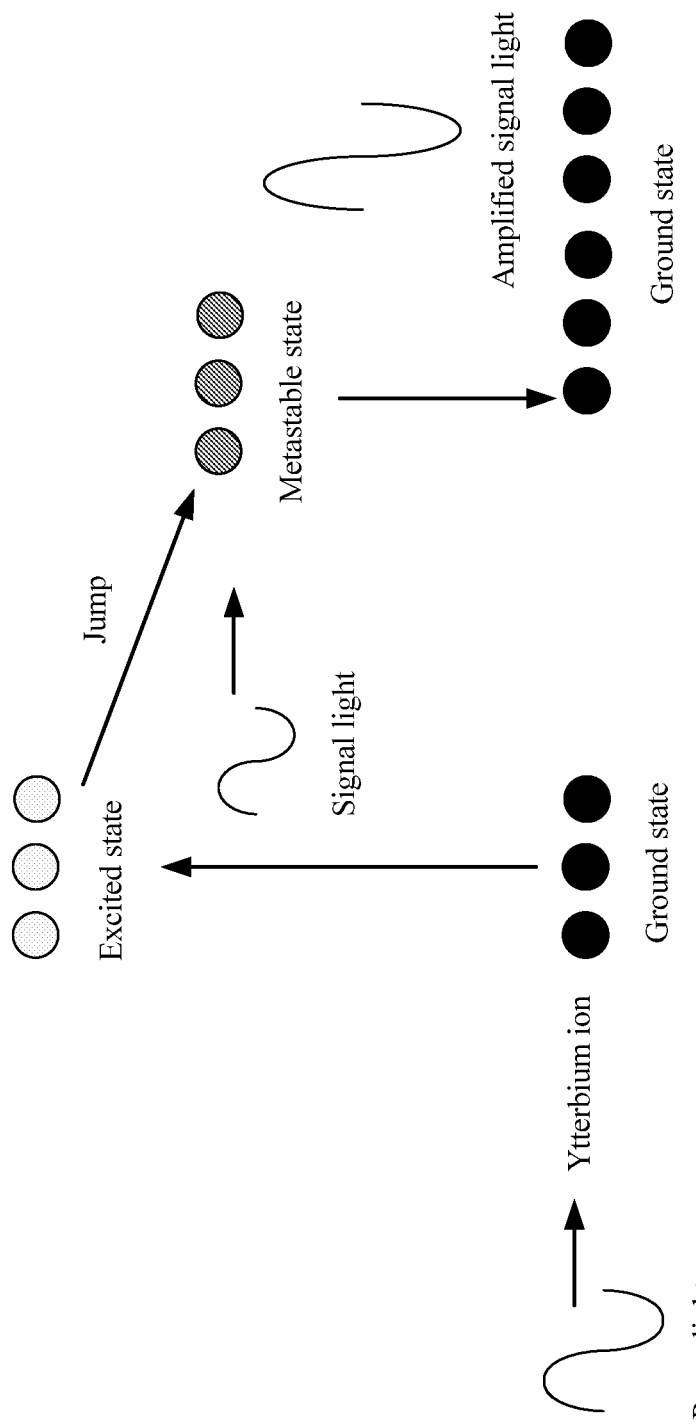
FIG. 4 is a schematic diagram of a signal light amplification principle disclosed in an embodiment of this application.

The ytterbium material is a material doped with ytterbium ions, the erbium material is a material doped with erbium ions, and the combination of an ytterbium material and an erbium material may be a material doped with both ytterbium ions and erbium ions. Rare-earth ions such as the ytterbium ions and the erbium ions are active ions and are used to transfer the energy of the pump light to the signal light. The ytterbium material is used as an example. As shown in FIG. 4, FIG. 4 is a schematic diagram of a signal light amplification principle disclosed in an embodiment of this application. If a wavelength of the pump light is 980 nm and a wavelength of the signal light is 1550 nm, after absorbing the 980 nm pump light, the ytterbium ions in the ytterbium material jump from a ground state to an excited state. The ytterbium ions are unstable in the excited state and soon jump to a metastable state. Therefore, when the ytterbium ions are excited by the signal light, the ytterbium ions jump back to the ground state from the metastable state in a form of stimulated radiation, and transmit signal light with the same wavelength of 1550 nm as that of the signal light, thereby implementing a function of amplifying the signal light.

Figure 5:
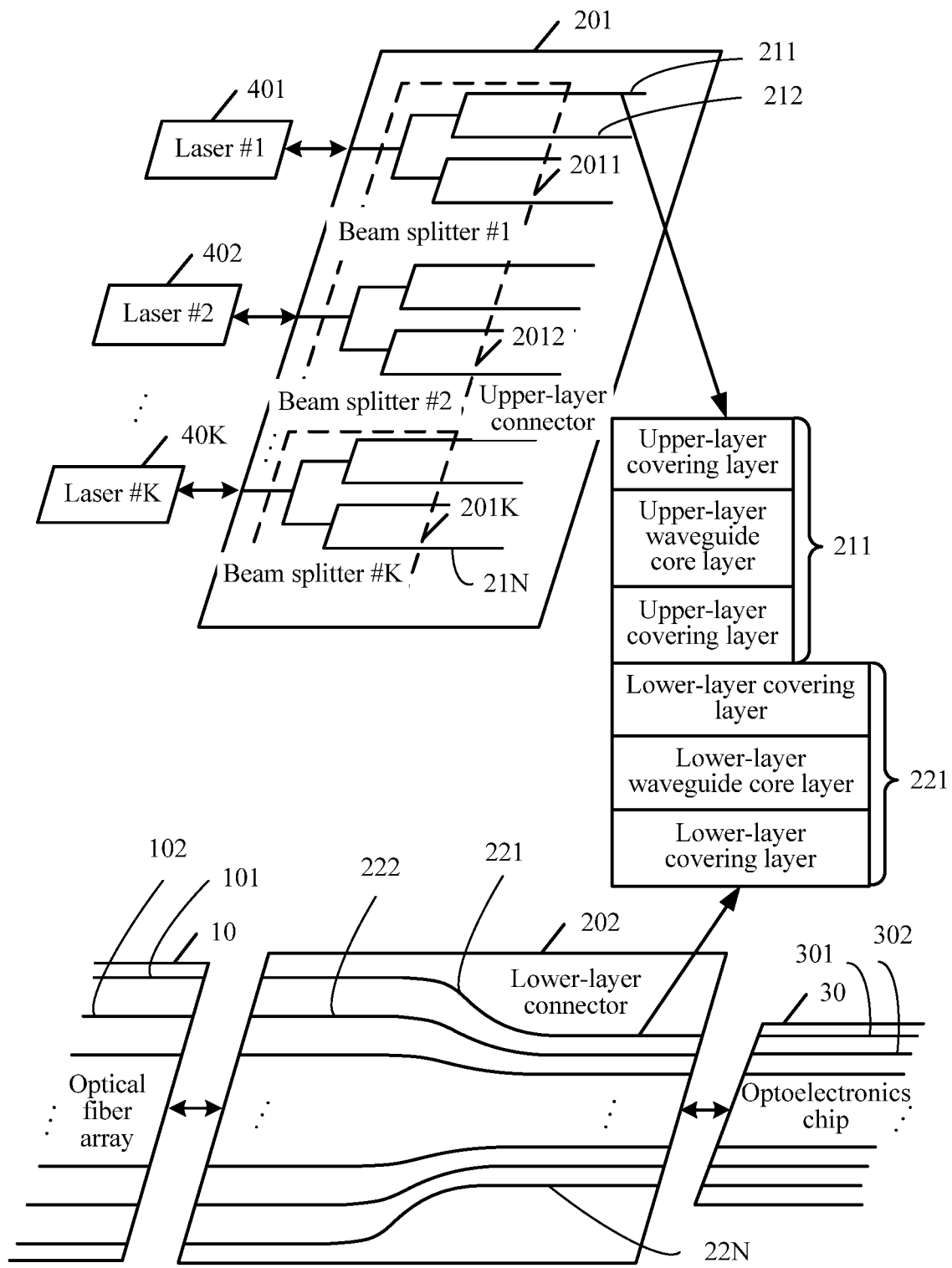
FIG. 5 is a schematic structural diagram of an optical coupling system disclosed in an embodiment of this application.

Based on the system architecture shown in FIG. 1a, an optical coupling system is disclosed. Referring to FIG. 5, FIG. 5 is a schematic structural diagram of an optical coupling system disclosed in an embodiment of this application. As shown in FIG. 5, the system architecture includes an optical fiber array 10, the optical coupling connector 20 illustrated in the system architecture shown in FIG. 1a, an optoelectronics chip 30, and at least one laser (401, 402, . . . ). The optical fiber array 10 includes N optical fibers (101, 102, . . . ). The optical coupling connector 20 may include an upper-layer connector 201 and a lower-layer connector 202. The upper-layer connector 201 includes at least one beam splitter (2011, 2012, . . . ) and N upper-layer waveguides (211, 212, . . . ). The lower-layer connector includes N lower-layer waveguides (221, 222, . . . ). The optoelectronics chip includes N optical waveguides (301, 302, . . . ).

One laser 401 (using a laser #1 as an example) is connected to one beam splitter 2011 (using a beam splitter #1 as an example), and the one beam splitter 2011 is connected to M upper-layer waveguides, where M and N are both positive integers and M is less than or equal to N. One optical fiber (for example, an optical fiber 101) in the optical fiber array is connected to one end of one lower-layer waveguide (for example, a lower-layer waveguide 221), and the other end of the one lower-layer waveguide (for example, the lower-layer waveguide 221) is connected to one optical waveguide (for example, an optical waveguide 301) in the optoelectronics chip 30. Each optical fiber is connected to a unique lower-layer waveguide (in other words, one optical fiber is correspondingly connected to one lower-layer waveguide; for example, the optical fiber 101 is correspondingly connected to the lower-layer waveguide 221). Each lower-layer waveguide is connected to a unique optical waveguide (in other words, one lower-layer waveguide is correspondingly connected to one optical waveguide; for example, the lower-layer waveguide 221 is correspondingly connected to the optical waveguide 301). One upper-layer waveguide corresponds to one lower-layer waveguide (for example, the upper-layer waveguide 211 corresponds to the lower-layer waveguide 221).

Original pump light generated by the one laser 401 (using the laser #1 as an example) is input to the one beam splitter 2011 (using the beam splitter #1 as an example). The one beam splitter 2011 splits the original pump light into M shares and outputs the M shares to the M upper-layer waveguides. One upper-layer waveguide (for example, the upper-layer waveguide 211) of the M upper-layer waveguides couples the received pump light to one corresponding lower-layer waveguide (for example, the lower-layer waveguide 221). The one corresponding lower-layer waveguide (for example, the lower-layer waveguide 221) couples the pump light and signal light input by one optical fiber (for example, the optical fiber 101) in the optical fiber array and converts the pump light into signal light to attenuate the pump light and amplify the signal light, and outputs the amplified signal light into one optical waveguide (for example, the optical waveguide 301) in the optoelectronics chip 30.

When the optical coupling system shown in FIG. 5 is implemented, the optical coupling connector 20 can amplify a plurality of channels of signal light in the optical fiber array 10 and output the amplified signal light to the optoelectronics chip 30. The optical coupling connector 20 not only can couple the optical fiber array 10 and the optoelectronics chip 30, and can also amplify the signal light in the optical coupling connector 20. This resolves a problem of an excessive signal light loss in the optical coupling connector 20.

Figure 6:
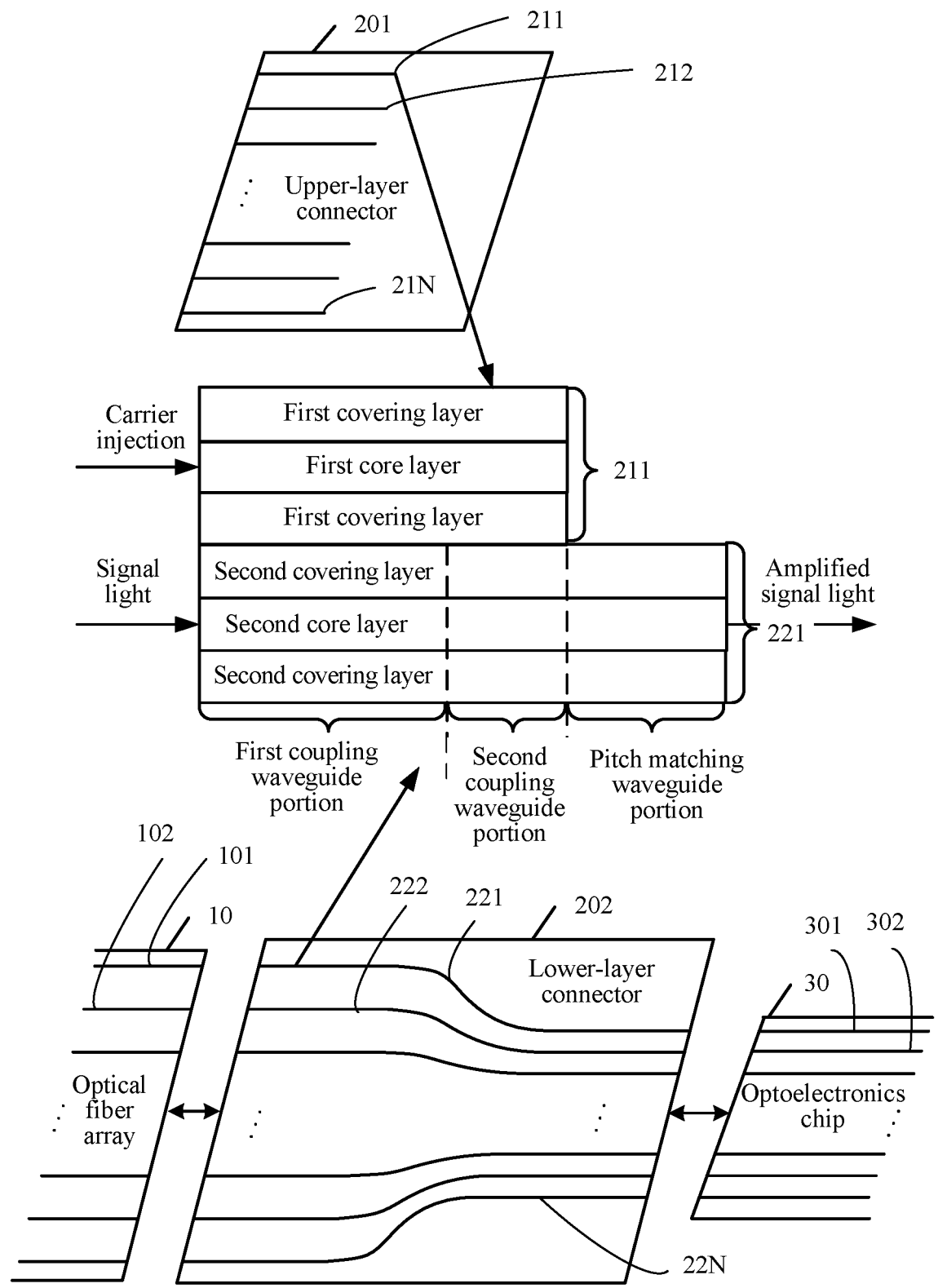
FIG. 6 is a schematic structural diagram of another optical coupling connector disclosed in an embodiment of this application.

Based on the system architecture shown in FIG. 1c, another optical coupling connector is disclosed. Referring to FIG. 6, FIG. 6 is a schematic structural diagram of another optical coupling connector disclosed in an embodiment of this application. The optical coupling connector 20 is configured to connect an optical fiber array 10 and an optoelectronics chip 30. The optical coupling connector 20 includes an upper-layer connector 201 and a lower-layer connector 202.

The upper-layer connector 201 includes N upper-layer amplification waveguides (for example, 211, 212, . . . in FIG. 6), where N is a positive integer greater than or equal to 2. The lower-layer connector 202 includes N lower-layer waveguides (for example, 221, 222, . . . in FIG. 6). The N lower-layer waveguides and the N upper-layer amplification waveguides are coupled in a one-to-one correspondence. Each lower-layer waveguide includes a first coupling waveguide portion, a second coupling waveguide portion, and a pitch matching waveguide portion. The optical fiber array 10 includes N optical fibers (for example, 101, 102, . . . in FIG. 6). The N optical fibers provide N channels of signal light for the N lower-layer waveguides. The optoelectronics chip 30 includes N optical waveguides (for example, 301, 302, . . . in FIG. 6). First ends of the N lower-layer waveguides are connected to the N optical fibers in a one-to-one correspondence, and second ends of the N lower-layer waveguides are connected to the N optical waveguides in a one-to-one correspondence.

Each upper-layer amplification waveguide includes a first core layer and a first covering layer. A material of the first core layer includes a gain material, the gain material can amplify signal light that is coupled to a corresponding upper-layer amplification waveguide by a lower-layer waveguide, and a refractive index of the first core layer is greater than a refractive index of the first covering layer.

Each lower-layer waveguide includes a second core layer and a second covering layer that covers the second core layer. The second core layer is configured to transmit the signal light, and a refractive index of the second core layer is greater than a refractive index of the second covering layer.

In this embodiment of this application, a waveguide is an apparatus for transmitting an electromagnetic wave. Each waveguide may independently transmit one channel of electromagnetic wave signal. A shape of the waveguide may be a rectangle, a circle, or the like. A core-layer material of the N lower-layer waveguides may be a material that causes a relatively small transmission loss to the electromagnetic wave, for example, silicon dioxide ($SiO_2$) that causes a relatively small transmission loss to an optical signal. A core-layer material of the N upper-layer amplification waveguides may be a semiconductor material, and optionally, is a direct band-gap semiconductor material, for example, gallium arsenide (GaAs) or indium phosphide (InP). The refractive index of the second core layer being greater than the refractive index of the second covering layer can ensure that a full reflection condition can be met when the signal light is transmitted in the second core layer of the lower-layer waveguide. The signal light is restricted in the core layer, reducing a transmission loss of the signal light in the lower-layer waveguide. A material of the second core layer may be silicon, silicon dioxide, silicon nitride, a polymer, or the like. Optionally, a height of a covering layer between an upper-layer amplification waveguide (for example, 211 in FIG. 6) and a corresponding lower-layer waveguide (for example, 22j in FIG. 6) is minimized, so that a loss of signal light in the covering layer can be reduced, thereby improving coupling efficiency of coupling the signal light from the lower-layer waveguide to the upper-layer amplification waveguide.

The following describes a signal light amplification principle with reference to FIG. 6. When signal light in the optical fiber array 10 enters a core layer (for example, the second core layer in FIG. 6) of one lower-layer waveguide (for example, 221 in FIG. 6) of the lower-layer connector, because the upper-layer amplification waveguide 211 and the lower-layer waveguide 221 are coupled in a one-to-one correspondence, the lower-layer waveguide 221 couples the received signal light to the upper-layer amplification waveguide 211 by using the first coupling waveguide portion. A core layer (for example, the first core layer in FIG. 6) of the upper-layer amplification waveguide 211 includes a gain material that can amplify the signal light. The upper-layer amplification waveguide 211 amplifies the signal light coupled into the upper-layer amplification waveguide 211. Then, the upper-layer amplification waveguide 211 couples the amplified signal light to the second coupling waveguide portion of the lower-layer waveguide 221, and the lower-layer waveguide 221 outputs the amplified signal light to the optoelectronics chip 30 by using the pitch matching waveguide portion. The optical coupling connector 20 shown in FIG. 6 can amplify a plurality of channels of signal light in the optical fiber array 10 and output the amplified signal light to the optoelectronics chip 30. This resolves a problem of an excessive signal light loss in the optical coupling connector 20. The optical coupling connector 20 shown in FIG. 6 has a simple structure and a small size, uses a simple preparation technique, and does not need a pump light source. Therefore, preparation costs thereof are relatively low.

Figure 6A:
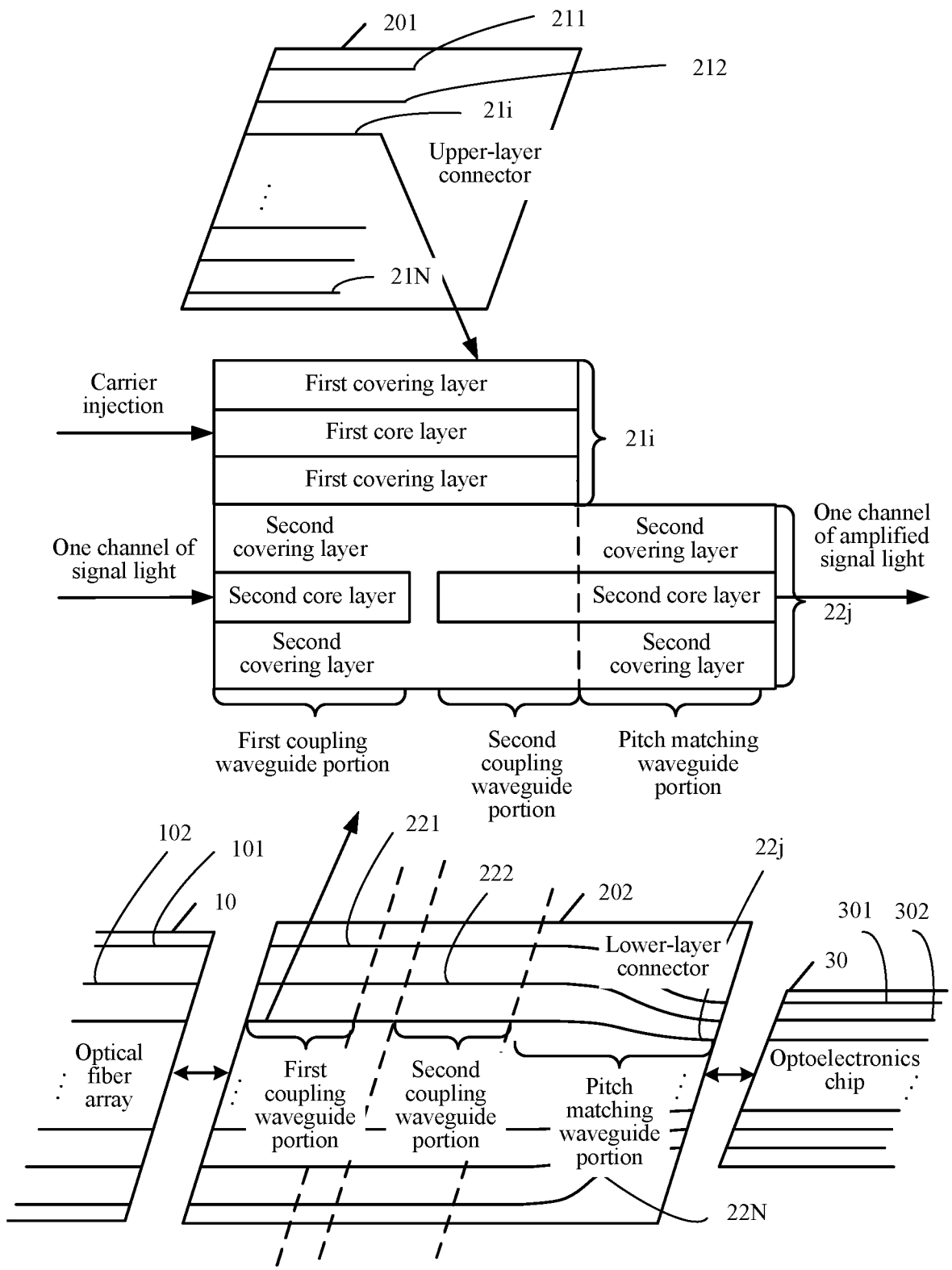
FIG. 6a is a schematic structural diagram of still another optical coupling connector disclosed in an embodiment of this application.
Figure 6B:
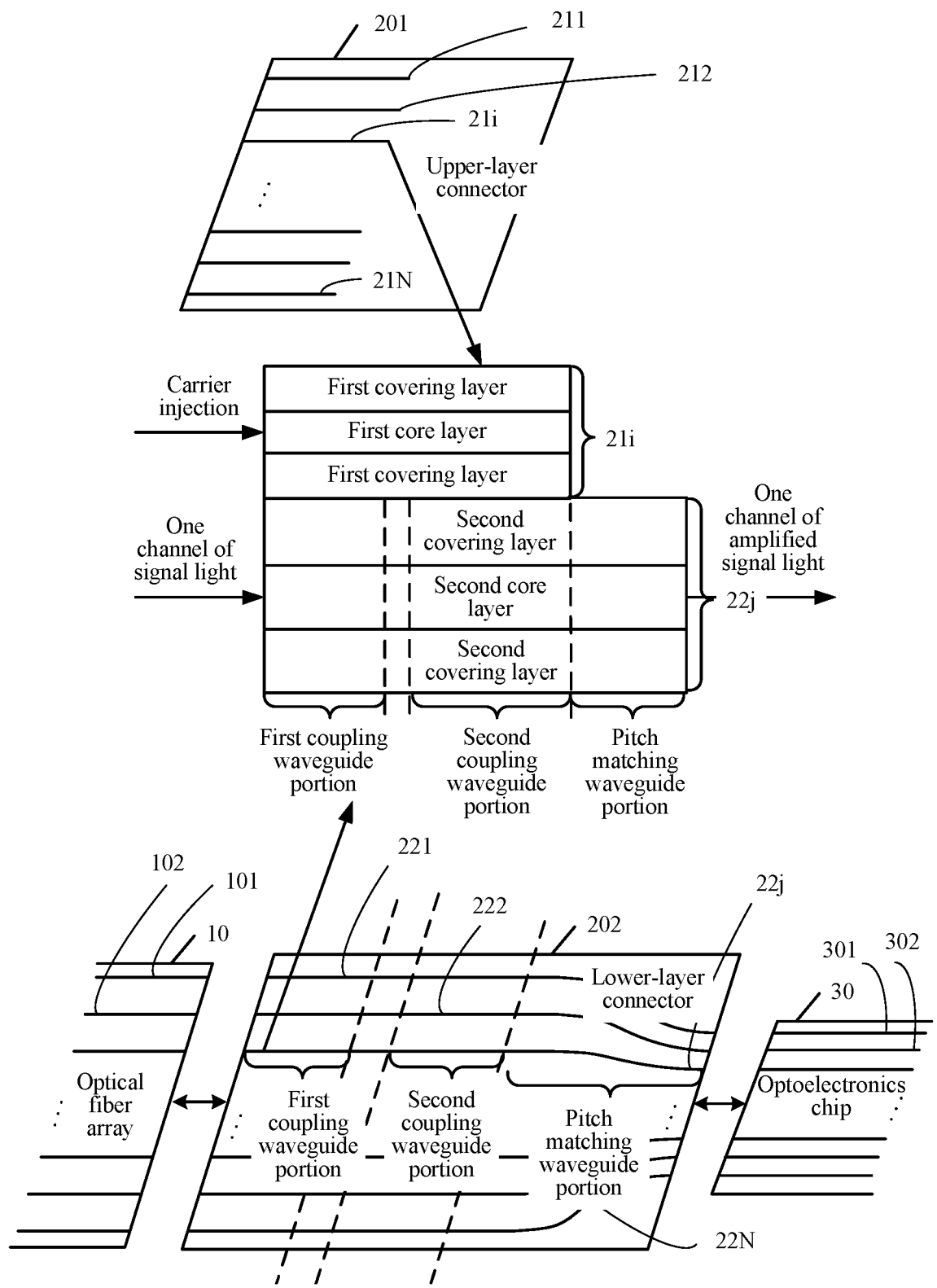
FIG. 6b is a schematic structural diagram of yet another optical coupling connector disclosed in an embodiment of this application.
Figure 6C:
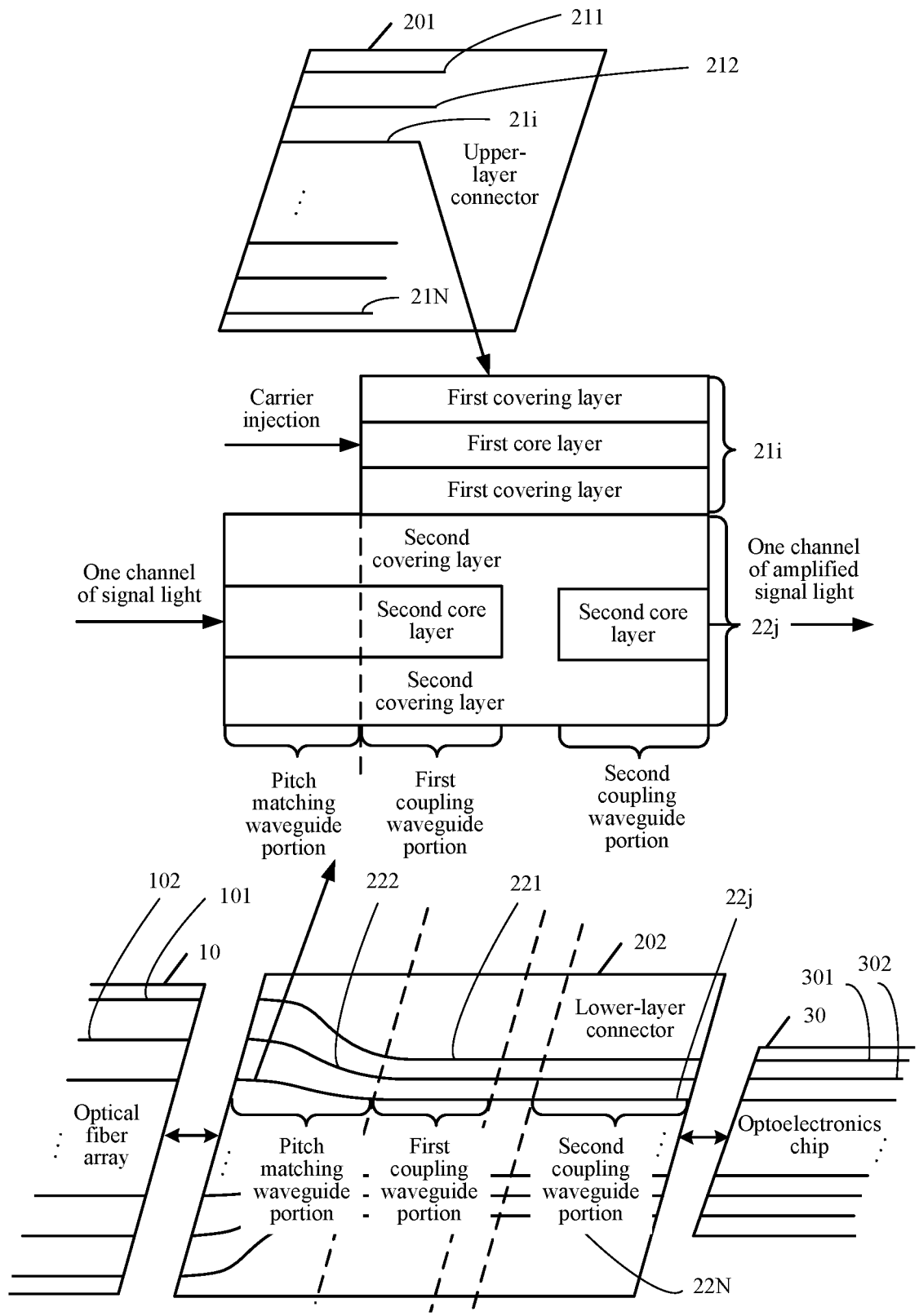
FIG. 6c is a schematic structural diagram of yet another optical coupling connector disclosed in an embodiment of this application.

In an embodiment, a core layer of the first coupling waveguide portion of each lower-layer waveguide is disconnected from a core layer of the second coupling waveguide portion, as shown in FIG. 6a and FIG. 6c.

In an embodiment, as shown in FIG. 6a (in FIG. 6a, the core layer of the first coupling waveguide portion of each lower-layer waveguide is disconnected from the core layer of the second coupling waveguide portion) or FIG. 6b (in FIG. 6b, the core layer of the first coupling waveguide portion of each lower-layer waveguide is connected to the core layer of the second coupling waveguide portion), a lower-layer waveguide j (for example, 22j in FIG. 6a or FIG. 6b) receives one channel of signal light emitted by the optical fiber array, a first coupling waveguide portion of the lower-layer waveguide j couples the one channel of signal light to a corresponding upper-layer amplification waveguide i (for example, 21i in FIG. 6a or FIG. 6b), the upper-layer amplification waveguide i amplifies the one channel of signal light and then couples the one channel of amplified signal light to a second coupling waveguide portion of the lower-layer waveguide j, the second coupling waveguide portion of the lower-layer waveguide j transmits the one channel of amplified signal light to a pitch matching waveguide portion of the lower-layer waveguide j, and the pitch matching waveguide portion of the lower-layer waveguide j transmits the one channel of amplified signal light to the optoelectronics chip 30. The upper-layer amplification waveguide i is any one of the N upper-layer amplification waveguides, and the lower-layer waveguide j is any one of the N lower-layer waveguides.

In the first coupling waveguide portion, the signal light is already fully or mostly coupled into the upper-layer amplification waveguide i. In this embodiment of this application, the signal light is first coupled to the upper-layer amplification waveguide from the first coupling waveguide portion of the lower-layer waveguide. The upper-layer amplification waveguide amplifies the signal light and then recouples the amplified signal light to the second coupling waveguide portion of the lower-layer waveguide. Finally, the signal light is output to the optoelectronics chip 30 after passing through the pitch matching waveguide portion.

In an embodiment, as shown in FIG. 6a or FIG. 6b, a pitch between first coupling waveguide portions of any two adjacent lower-layer waveguides of the N lower-layer waveguides is equal to a pitch between any two adjacent optical fibers in the optical fiber array, and a minimum pitch between pitch matching waveguide portions of any two adjacent lower-layer waveguides of the N lower-layer waveguides is equal to a pitch between any two adjacent optical waveguides in the optoelectronics chip 30.

The pitch between the first coupling waveguide portions of any two adjacent lower-layer waveguides of the N lower-layer waveguides being equal to the pitch between any two adjacent optical fibers in the optical fiber array 10 can ensure that the optical fiber array 10 is better coupled to one end (an end near the first coupling waveguide portions) of the lower-layer connector 202 of the optical coupling connector 20, thereby reducing a coupling loss incurred when the signal light is transmitted from the optical fiber array 10 to the lower-layer connector 202. The minimum pitch between the pitch matching waveguide portions of any two adjacent lower-layer waveguides of the N lower-layer waveguides being equal to the pitch between any two adjacent optical waveguides in the optoelectronics chip 30 can ensure that the other end (an end near the pitch matching waveguide portions, that is, a position with the minimum pitch between pitch matching waveguide portions of adjacent lower-layer waveguides) of the lower-layer connector 202 of the optical coupling connector 20 is better coupled to the optoelectronics chip 30, thereby reducing a coupling loss incurred when the signal light is transmitted from the lower-layer connector 202 to the optoelectronics chip 30.

Figure 6D:
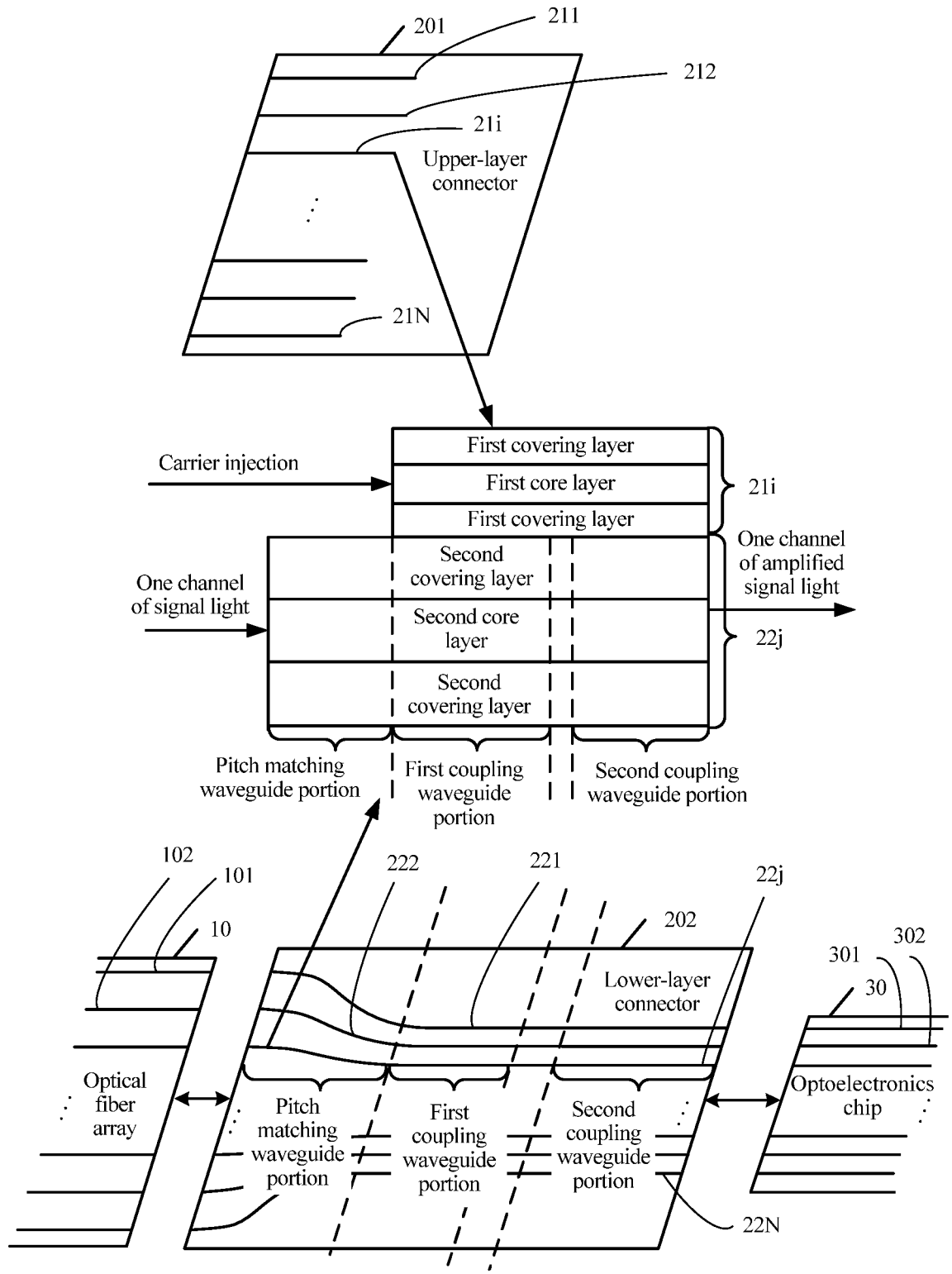
FIG. 6d is a schematic structural diagram of yet another optical coupling connector disclosed in an embodiment of this application.

In an embodiment, as shown in FIG. 6c (in FIG. 6c, the core layer of the first coupling waveguide portion of each lower-layer waveguide is disconnected from the core layer of the second coupling waveguide portion) or FIG. 6d (in FIG. 6d, the core layer of the first coupling waveguide portion of each lower-layer waveguide is connected to the core layer of the second coupling waveguide portion), a lower-layer waveguide j receives one channel of signal light emitted by the optical fiber array, a pitch matching waveguide portion of the lower-layer waveguide j transmits the one channel of signal light to a first coupling waveguide portion of the lower-layer waveguide j, the first coupling waveguide portion of the lower-layer waveguide j couples the one channel of signal light to a corresponding upper-layer amplification waveguide i, the upper-layer amplification waveguide i amplifies the one channel of signal light and then couples the one channel of amplified signal light to a second coupling waveguide portion of the lower-layer waveguide j, the second coupling waveguide portion of the lower-layer waveguide j transmits the one channel of amplified signal light to the optoelectronics chip. The upper-layer amplification waveguide i is any one of the N upper-layer amplification waveguides, and the lower-layer waveguide j is any one of the N lower-layer waveguides.

In the first coupling waveguide portion, the signal light is already fully or mostly coupled into the upper-layer amplification waveguide i. In this embodiment of this application, the signal light is first output to the first coupling waveguide portion by using the pitch matching waveguide portion of the lower-layer waveguide, and then coupled to the upper-layer amplification waveguide from the lower-layer waveguide. The upper-layer amplification waveguide amplifies the signal light and then recouples the amplified signal light to the lower-layer waveguide, and the lower-layer waveguide finally outputs the amplified signal light to the optoelectronics chip 30.

In an embodiment, a maximum pitch between pitch matching waveguide portions of any two adjacent lower-layer waveguides of the N lower-layer waveguides is equal to a pitch between any two adjacent optical fibers in the optical fiber array, and a pitch between second coupling waveguide portions of any two adjacent lower-layer waveguides of the N lower-layer waveguides is equal to a pitch between any two adjacent optical waveguides in the optoelectronics chip 30.

The maximum pitch between the pitch matching waveguide portions of any two adjacent lower-layer waveguides of the N lower-layer waveguides being equal to the pitch between any two adjacent optical fibers in the optical fiber array can ensure that the optical fiber array 10 is better coupled to one end (an end near the pitch matching waveguide portions, that is, a position with the maximum pitch between the adjacent pitch matching waveguide portions) of the lower-layer connector 202 of the optical coupling connector 20, thereby reducing a coupling loss incurred when the signal light is transmitted from the optical fiber array 10 to the lower-layer connector 202. The pitch between second coupling waveguide portions of any two adjacent lower-layer waveguides of the N lower-layer waveguides being equal to the pitch between any two adjacent optical waveguides in the optoelectronics chip 30 can ensure that the other end (an end near the second coupling waveguide portions) of the lower-layer connector 202 of the optical coupling connector 20 is better coupled to the optoelectronics chip 30, thereby reducing a coupling loss incurred when the signal light is transmitted from the lower-layer connector 202 to the optoelectronics chip 30.

In an embodiment, as shown in FIG. 6a to FIG. 6d, the N upper-layer amplification waveguides and the N lower-layer waveguides are all rectangular waveguides, a core layer height and a core layer width of the first core layer meet a single-mode transmission condition, and a core layer height and a core layer width of the second core layer meet the single-mode transmission condition.

Because the core layer height and the core layer width of the first core layer meet the single-mode transmission condition, and the core layer height and the core layer width of the second core layer meet the single-mode transmission condition, the signal light is transmitted in only one mode in the lower-layer waveguide and the upper-layer amplification waveguide, thereby reducing a transmission loss of the signal light in the lower-layer waveguide and the upper-layer amplification waveguide.

In an embodiment, as shown in FIG. 1d, a core layer height of the first coupling waveguide portion is constant, a core layer width of the first coupling waveguide portion gradually decreases along a propagation direction of the signal light, a core layer height of the second coupling waveguide portion is constant, and a core layer width of the second coupling waveguide portion gradually increases along the propagation direction of the signal light.

The core layer height of the first coupling waveguide portion (the first lower-layer coupling area in FIG. 1d) is constant, and the core layer width of the first coupling waveguide portion gradually decreases along the propagation direction of the signal light, so that the signal light is gradually coupled from the lower-layer waveguide to the upper-layer amplification waveguide, thereby improving coupling efficiency of coupling the signal light from the lower-layer waveguide to the upper-layer amplification waveguide. The core layer height of the second coupling waveguide portion (the second lower-layer coupling area in FIG. 1d) is constant, and the core layer width of the second coupling waveguide portion gradually increases along the propagation direction of the signal light, thereby improving coupling efficiency of coupling the amplified signal light from the upper-layer amplification waveguide to the lower-layer waveguide.

In an embodiment, as shown in FIG. 6a to FIG. 6d, the gain material is a semiconductor material.

When a carrier is injected into the semiconductor material, the semiconductor material amplifies the signal light by using the carrier. Optionally, the semiconductor material is a direct band-gap semiconductor material, for example, gallium arsenide (GaAs) or indium phosphide (InP).

Figure 7:
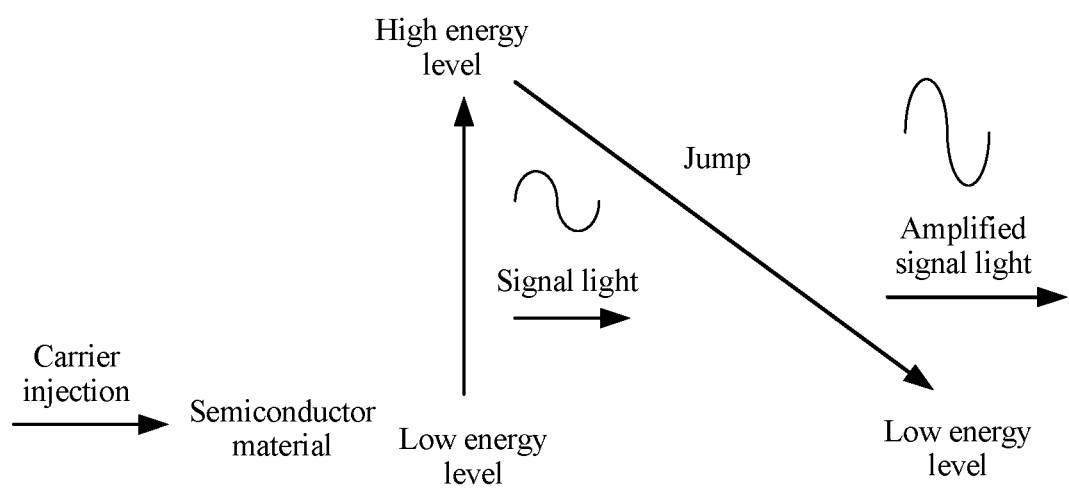
FIG. 7 is a schematic diagram of another signal light amplification principle disclosed in an embodiment of this application.

The following describes a signal light amplification principle with reference to FIG. 7. As shown in FIG. 7, when a carrier (an electron or an electron hole) is injected into a semiconductor material, a density of free electrons in the semiconductor material is increased, a quantity of electrons at a low energy level is greatly increased, and the electrons at the low energy level jump to a high energy level in the semiconductor material (which, optionally, is a direct band-gap semiconductor). When the semiconductor material is excited by signal light, the electrons at the high energy level jump back to the low energy level in a form of stimulated radiation and transmit signal light with a same wavelength as that of the signal light, thereby implementing a function of amplifying the signal light.

Figure 8:
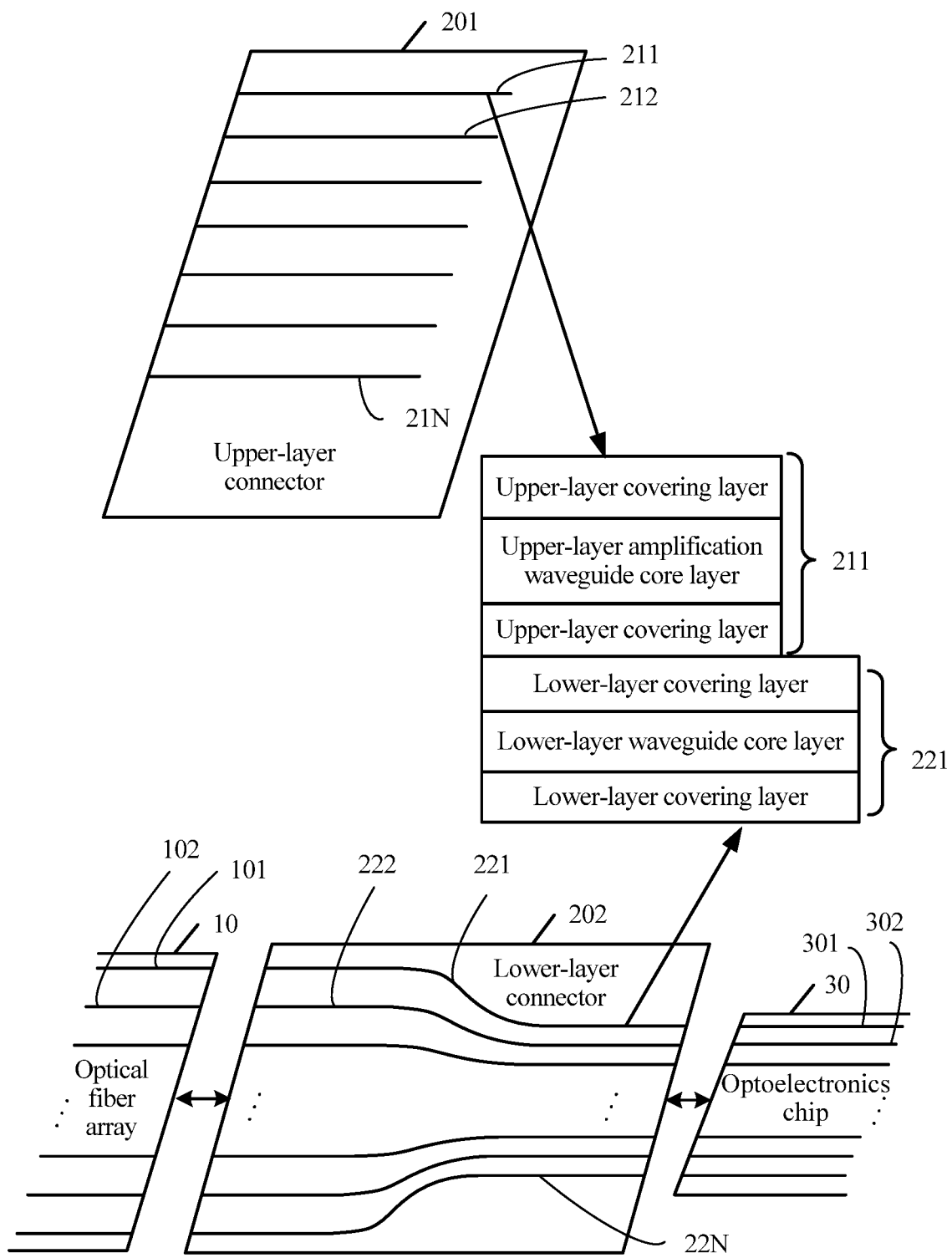
FIG. 8 is a schematic structural diagram of still another optical coupling system disclosed in an embodiment of this application.

Based on the system architecture shown in FIG. 1c, another optical coupling system is disclosed. Referring to FIG. 8, FIG. 8 is a schematic structural diagram of another optical coupling system disclosed in an embodiment of this application. As shown in FIG. 8, the optical coupling system includes an optical fiber array 10, an optoelectronics chip 30, and the optical coupling connector 20 illustrated in the system architecture shown in FIG. 1c.

The optical fiber array 10 includes N optical fibers, the optoelectronics chip 30 includes N optical waveguides, and the optical coupling connector 20 may include an upper-layer connector 201 and a lower-layer connector 202. The upper-layer connector 201 includes N upper-layer amplification waveguides, and the lower-layer connector 202 includes N lower-layer waveguides. The N lower-layer waveguides and the N upper-layer amplification waveguides are connected in a one-to-one correspondence. The N optical fibers of the optical fiber array 10 and the N lower-layer waveguides of the optical coupling connector 20 are connected in a one-to-one correspondence. The N lower-layer waveguides of the optical coupling connector 20 and the N optical waveguides of the optoelectronics chip 30 are connected in a one-to-one correspondence.

The N optical fibers of the optical fiber array 10 output N channels of signal light to the N lower-layer waveguides of the optical coupling connector 20, the N lower-layer waveguides respectively couple the N channels of signal light to the N upper-layer amplification waveguides of the optical coupling connector 20, the N upper-layer amplification waveguides respectively amplify the N channels of signal light and couple the N channels of amplified signal light to the N lower-layer waveguides, and the N lower-layer waveguides respectively output the N channels of amplified signal light to the N optical waveguides of the optoelectronics chip 30.

When the optical coupling system shown in FIG. 8 is implemented, the optical coupling connector 20 can amplify a plurality of channels of signal light in the optical fiber array 10 and output the amplified signal light to the optoelectronics chip 30. The optical coupling connector 20 not only can couple the optical fiber array 10 and the optoelectronics chip 30, and can also amplify the signal light in the optical coupling connector 20. This resolves a problem of an excessive signal light loss in the optical coupling connector 20.

Figure 9:
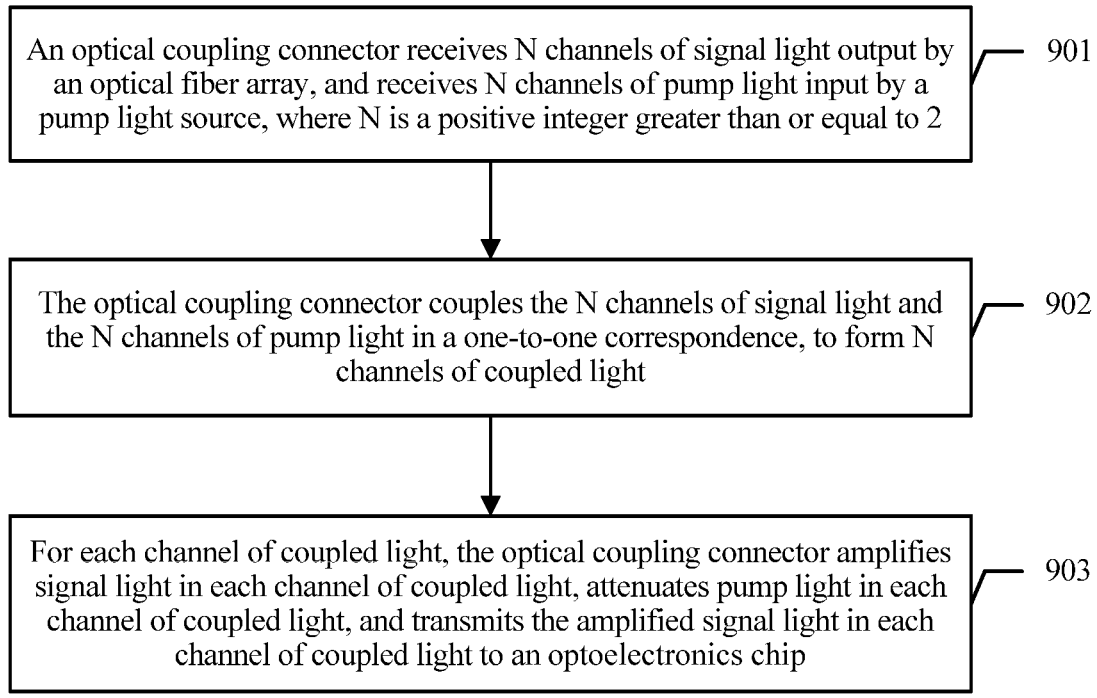
FIG. 9 is a schematic flowchart of a waveguide coupling method disclosed in an embodiment of this application.

Based on the system architecture shown in FIG. 1*a*, a waveguide coupling method is disclosed. Referring to FIG. 9, FIG. 9 is a schematic flowchart of a waveguide coupling method disclosed in an embodiment of this application. As shown in FIG. 9, the waveguide coupling method includes the following steps:

901. An optical coupling connector receives N channels of signal light output by an optical fiber array, and receives N channels of pump light input by a pump light source, where N is a positive integer greater than or equal to 2.

902. The optical coupling connector couples the N channels of signal light and the N channels of pump light in a one-to-one correspondence, to form N channels of coupled light.

903. For each channel of coupled light, the optical coupling connector amplifies signal light in each channel of coupled light, attenuates pump light in each channel of coupled light, and transmits the amplified signal light in each channel of coupled light to an optoelectronics chip.

In this embodiment of this application, the optical coupling connector is configured to connect the optical fiber array and the optoelectronics chip, and the optical coupling connector may include an upper-layer connector and a lower-layer connector. The upper-layer connector can receive the N channels of signal light output by the optical fiber array, and the lower-layer connector can receive the N channels of pump light input by the pump light source. After receiving the N channels of signal light and the N channels of pump light, the optical coupling connector couples the N channels of signal light and the N channels of pump light in a one-to-one correspondence, to form the N channels of coupled light. The optical coupling connector amplifies the signal light in each channel of coupled light, attenuates the pump light in each channel of coupled light, and transmits the amplified signal light in each channel of coupled light to the optoelectronics chip. In this embodiment of this application, the optical coupling connector not only can couple the optical fiber array and the optoelectronics chip, and can also amplify the signal light in the optical coupling connector. This resolves a problem of an excessive signal light loss in the optical coupling connector.

In an embodiment, specifically, the optical coupling connector includes N upper-layer waveguides, and the optical coupling connector receives the N channels of pump light respectively by using the N upper-layer waveguides.

The upper-layer connector of the optical coupling connector may include N upper-layer waveguides.

In an embodiment, specifically, the optical coupling connector further includes N lower-layer waveguides, and each lower-layer waveguide of the N lower-layer waveguides includes a coupling waveguide portion and a signal light amplification waveguide portion; and that the optical coupling connector couples the N channels of signal light and the N channels of pump light in a one-to-one correspondence, to form N channels of coupled light includes:

coupling, by the coupling waveguide portions of the N lower-layer waveguides in the optical coupling connector, the N channels of signal light and the N channels of pump light in a one-to-one correspondence, to form the N channels of coupled light.

In addition to including the coupling waveguide portion and the signal light amplification waveguide portion, each lower-layer waveguide of the N lower-layer waveguides further includes a pitch matching waveguide portion. The pitch matching waveguide portion is configured to match a pitch between any two adjacent optical fibers in the optical fiber array and a pitch between any two adjacent optical waveguides in the optoelectronics chip. A coupling waveguide portion of one lower-layer waveguide in the optical coupling connector receives one channel of signal light output by the optical fiber array, receives one channel of pump light coupled into the lower-layer waveguide by one upper-layer waveguide, and couples the one channel of signal light and the one channel of pump light to form one channel of coupled light.

In an embodiment, that the optical coupling connector amplifies signal light in each channel of coupled light, attenuates pump light in each channel of coupled light, and transmits the amplified signal light in each channel of coupled light to an optoelectronics chip includes:

amplifying, by the signal light amplification waveguide portion of each lower-layer waveguide in the optical coupling connector, the signal light in each channel of coupled light, attenuating the pump light in each channel of coupled light, and transmitting the amplified signal light in each channel of coupled light to the optoelectronics chip.

When the waveguide coupling method shown in FIG. 9 is implemented, the optical coupling connector can amplify the signal light in the optical fiber array and output the amplified signal light to the optoelectronics chip. This resolves a problem of an excessive signal light loss in the optical coupling connector.

Figure 10:
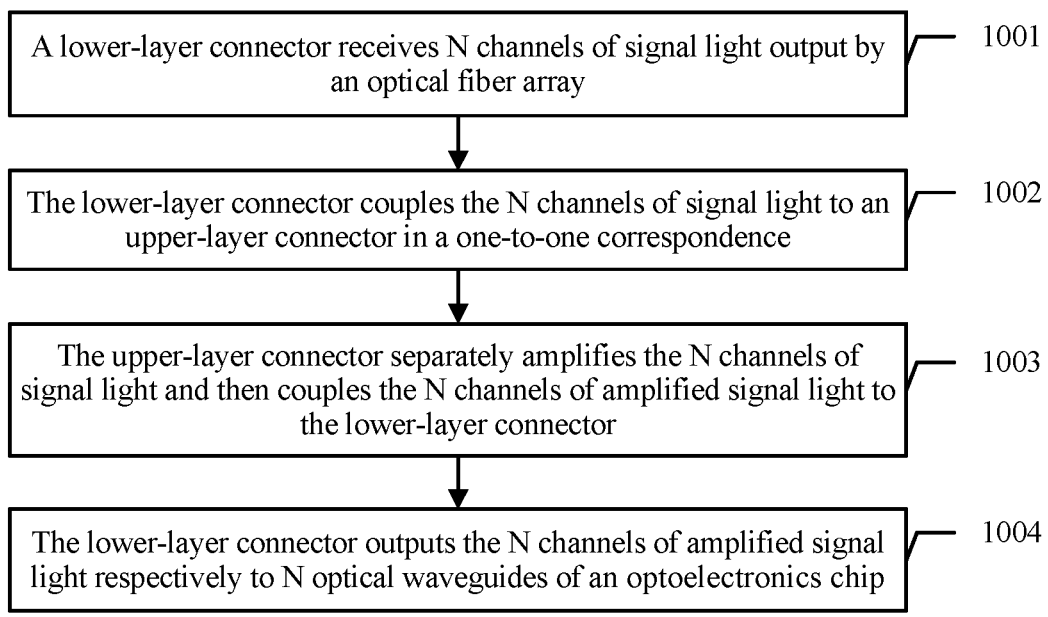
FIG. 10 is a schematic flowchart of another waveguide coupling method disclosed in an embodiment of this application.

Based on the system architecture shown in FIG. 1*c*, another waveguide coupling method is disclosed. Referring to FIG. 10, FIG. 10 is a schematic flowchart of another waveguide coupling method disclosed in an embodiment of this application. As shown in FIG. 10, the waveguide coupling method includes the following steps:

1001. A lower-layer connector receives N channels of signal light output by an optical fiber array.

1002. The lower-layer connector couples the N channels of signal light to an upper-layer connector in a one-to-one correspondence.

1003. The upper-layer connector separately amplifies the N channels of signal light and then couples the N channels of amplified signal light to the lower-layer connector.

1004. The lower-layer connector outputs the N channels of amplified signal light respectively to N optical waveguides of an optoelectronics chip.

In this embodiment of this application, the optical coupling connector may include the upper-layer connector and the lower-layer connector. The lower-layer connector receives the N channels of signal light output by the optical fiber array, and couples the N channels of signal light to the upper-layer connector in a one-to-one correspondence. After receiving the N channels of signal light, the upper-layer connector separately amplifies the N channels of signal light and then couples the N channels of amplified signal light to the lower-layer connector. The lower-layer connector outputs the N channels of amplified signal light respectively to the N optical waveguides of the optoelectronics chip. When this embodiment of this application is implemented, the signal light in the optical coupling connector can be amplified. This resolves a problem of an excessive signal light loss in the optical coupling connector.

In an embodiment, specifically, the lower-layer connector includes N lower-layer waveguides, each lower-layer waveguide of the N lower-layer waveguides includes a first coupling waveguide portion and a second coupling waveguide portion, and that the lower-layer connector couples the N channels of signal light to an upper-layer connector in a one-to-one correspondence includes:

coupling, by the first coupling waveguide portions of the N lower-layer waveguides in the lower-layer connector, the N channels of signal light to the upper-layer connector in a one-to-one correspondence.

In addition to including the first coupling waveguide portion and the second coupling waveguide portion, each lower-layer waveguide of the N lower-layer waveguides further includes a pitch matching waveguide portion. The pitch matching waveguide portion is configured to match a pitch between any two adjacent optical fibers in the optical fiber array and a pitch between any two adjacent optical waveguides in the optoelectronics chip.

In an embodiment, that the upper-layer connector separately amplifies the N channels of signal light and then couples the N channels of amplified signal light to the lower-layer connector includes:

separately amplifying, by the upper-layer connector, the N channels of signal light and then coupling the N channels of amplified signal light to the second coupling waveguide portions of the N lower-layer waveguides in the lower-layer connector.

In an embodiment, specifically, that the upper-layer connector separately amplifies the N channels of signal light and then couples the N channels of amplified signal light to the lower-layer connector includes:

injecting a carrier into the upper-layer connector, where the upper-layer connector separately amplifies the N channels of signal light by using the carrier and couples the N channels of amplified signal light respectively to the second coupling waveguide portions of the N lower-layer waveguides of the lower-layer connector.

The carrier may include an electron or an electron hole.

When the waveguide coupling method shown in FIG. 10 is implemented, the optical coupling connector can amplify the signal light in the optical fiber array and output the amplified signal light to the optoelectronics chip. This resolves a problem of an excessive signal light loss in the optical coupling connector.

A sequence of the steps of the methods in the embodiments of this application may be adjusted, combined, or removed according to an actual requirement.

The optical coupling connector, the optical coupling system, and the waveguide coupling method disclosed in the embodiments of this application are described in detail above. The principle and implementation of this application are described herein through specific examples. The description about the embodiments is merely provided to help understand the method and core ideas of this application. In addition, persons of ordinary skill in the art can make variations and modifications to this application in terms of the specific implementations and application scopes according to the ideas of this application. Therefore, the content of the specification shall not be construed as a limit to this application.

What is claimed is:

1. An optical coupling connector, configured to connect an optical fiber array and an optoelectronics chip, comprising:
    an upper-layer connector that comprises N upper-layer amplification waveguides, wherein N is a positive integer greater than or equal to 2;
    a lower-layer connector that comprises N lower-layer waveguides, wherein the N lower-layer waveguides and the N upper-layer amplification waveguides are coupled in a one-to-one correspondence, and each lower-layer waveguide comprises a first coupling waveguide portion, a second coupling waveguide portion, and a pitch matching waveguide portion;
    wherein the optical fiber array comprises N optical fibers, wherein the N optical fibers provide N channels of signal light for the N lower-layer waveguides, and wherein the optoelectronics chip comprises N optical waveguides, wherein first ends of the N lower-layer waveguides are connected to the N optical fibers in a one-to-one correspondence, and second ends of the N lower-layer waveguides are connected to the N optical waveguides in a one-to-one correspondence;
    wherein each upper-layer amplification waveguide comprises a first core layer and a first covering layer that covers the first core layer, wherein a material of the first core layer comprises a gain material, the gain material to amplify signal light that is coupled to a corresponding upper-layer amplification waveguide by a lower-layer waveguide, and a refractive index of the first core layer is greater than a refractive index of the first covering layer; and
    wherein each lower-layer waveguide comprises a second core layer and a second covering layer that covers the second core layer, wherein the second core layer is configured to transmit the signal light, and a refractive index of the second core layer is greater than a refractive index of the second covering layer.

2. The optical coupling connector according to claim 1, wherein a core layer of the first coupling waveguide portion of each lower-layer waveguide is disconnected from a core layer of the second coupling waveguide portion.

3. The optical coupling connector according to claim 2, wherein:
    a lower-layer waveguide j receives one channel of signal light emitted by the optical fiber array,
    a first coupling waveguide portion of the lower-layer waveguide j couples the one channel of signal light to a corresponding upper-layer amplification waveguide i,
    the upper-layer amplification waveguide i amplifies the one channel of signal light and then couples the one channel of amplified signal light to a second coupling waveguide portion of the lower-layer waveguide j,
    the second coupling waveguide portion of the lower-layer waveguide j transmits the one channel of amplified signal light to a pitch matching waveguide portion of the lower-layer waveguide j, and
    the pitch matching waveguide portion of the lower-layer waveguide j transmits the one channel of amplified signal light to the optoelectronics chip; and
    wherein the upper-layer amplification waveguide i is any one of the N upper-layer amplification waveguides, and the lower-layer waveguide j is any one of the N lower-layer waveguides.

4. The optical coupling connector according to claim 2, wherein
    a lower-layer waveguide j receives one channel of signal light emitted by the optical fiber array,
    a pitch matching waveguide portion of the lower-layer waveguide j transmits the one channel of signal light to a first coupling waveguide portion of the lower-layer waveguide j,
    the first coupling waveguide portion of the lower-layer waveguide j couples the one channel of signal light to a corresponding upper-layer amplification waveguide i,
    the upper-layer amplification waveguide i amplifies the one channel of signal light and then couples the one channel of amplified signal light to a second coupling waveguide portion of the lower-layer waveguide j, and the second coupling waveguide portion of the lower-layer waveguide j transmits the one channel of amplified signal light to the optoelectronics chip; and wherein the upper-layer amplification waveguide i is any one of the N upper-layer amplification waveguides, and the lower-layer waveguide j is any one of the N lower-layer waveguides.

5. The optical coupling connector according to claim 3, wherein a pitch between first coupling waveguide portions of any two adjacent lower-layer waveguides of the N lower-layer waveguides is equal to a pitch between any two adjacent optical fibers in the optical fiber array, and a minimum pitch between pitch matching waveguide portions of any two adjacent lower-layer waveguides of the N lower-layer waveguides is equal to a pitch between any two adjacent optical waveguides in the optoelectronics chip.

6. The optical coupling connector according to claim 4, wherein a maximum pitch between pitch matching waveguide portions of any two adjacent lower-layer waveguides of the N lower-layer waveguides is equal to a pitch between any two adjacent optical fibers in the optical fiber array, and a pitch between second coupling waveguide portions of any two adjacent lower-layer waveguides of the N lower-layer waveguides is equal to a pitch between any two adjacent optical waveguides in the optoelectronics chip.

7. The optical coupling connector according to claim 2, wherein the N upper-layer amplification waveguides and the N lower-layer waveguides are all rectangular waveguides, a core layer height and a core layer width of the first core layer meet a single-mode transmission condition, and a core layer height and a core layer width of the second core layer meet the single-mode transmission condition.

8. The optical coupling connector according to claim 7, wherein a core layer height of the first coupling waveguide portion is constant, a core layer width of the first coupling waveguide portion gradually decreases along a propagation direction of the signal light, a core layer height of the second coupling waveguide portion is constant, and a core layer width of the second coupling waveguide portion gradually increases along the propagation direction of the signal light.

9. The optical coupling connector according to claim 1, wherein the gain material is a semiconductor material.

10. The optical coupling connector according to claim 9, wherein when a carrier is injected into the semiconductor material, the semiconductor material amplifies the signal light by using the carrier.

11. An optical coupling system, comprising:
an optical fiber array;
an optoelectronics chip; and
an optical coupling connector;
wherein the optical coupling connector comprises an upper-layer connector and a lower-layer connector, wherein the upper-layer connector comprises N upper-layer amplification waveguides, wherein N is a positive integer greater than or equal to 2, wherein the lower-layer connector comprises N lower-layer waveguides, wherein the N lower-layer waveguides and the N upper-layer amplification waveguides are coupled in a one-to-one correspondence, and each lower-layer waveguide comprises a first coupling waveguide portion, a second coupling waveguide portion, and a pitch matching waveguide portion;

wherein the optical fiber array comprises N optical fibers, wherein the N optical fibers provide N channels of signal light for the N lower-layer waveguides, and wherein the optoelectronics chip comprises N optical waveguides, wherein first ends of the N lower-layer waveguides are connected to the N optical fibers in a one-to-one correspondence, and second ends of the N lower-layer waveguides are connected to the N optical waveguides in a one-to-one correspondence;

each upper-layer amplification waveguide comprises a first core layer and a first covering layer that covers the first core layer, wherein a material of the first core layer comprises a gain material, the gain material to amplify signal light that is coupled to a corresponding upper-layer amplification waveguide by a lower-layer waveguide, and a refractive index of the first core layer is greater than a refractive index of the first covering layer; and each lower-layer waveguide comprises a second core layer and a second covering layer that covers the second core layer, wherein the second core layer is configured to transmit the signal light, and a refractive index of the second core layer is greater than a refractive index of the second covering layer;

the N optical fibers of the optical fiber array output N channels of signal light to the N lower-layer waveguides of the optical coupling connector, the N lower-layer waveguides respectively couple the N channels of signal light to the N upper-layer amplification waveguides of the optical coupling connector, the N upper-layer amplification waveguides respectively amplify the N channels of signal light and couple the N channels of amplified signal light to the N lower-layer waveguides, and the N lower-layer waveguides respectively output the N channels of amplified signal light to the N optical waveguides of the optoelectronics chip.

12. The optical coupling system according to claim 11, wherein a core layer of the first coupling waveguide portion of each lower-layer waveguide is disconnected from a core layer of the second coupling waveguide portion.

13. The optical coupling system according to claim 12, wherein:
a lower-layer waveguide j receives one channel of signal light emitted by the optical fiber array,
a first coupling waveguide portion of the lower-layer waveguide j couples the one channel of signal light to a corresponding upper-layer amplification waveguide i,
the upper-layer amplification waveguide i amplifies the one channel of signal light and then couples the one channel of amplified signal light to a second coupling waveguide portion of the lower-layer waveguide j,
the second coupling waveguide portion of the lower-layer waveguide j transmits the one channel of amplified signal light to a pitch matching waveguide portion of the lower-layer waveguide j, and
the pitch matching waveguide portion of the lower-layer waveguide j transmits the one channel of amplified signal light to the optoelectronics chip; and
wherein the upper-layer amplification waveguide i is any one of the N upper-layer amplification waveguides, and the lower-layer waveguide j is any one of the N lower-layer waveguides.

14. The optical coupling system according to claim 12, wherein:
a lower-layer waveguide j receives one channel of signal light emitted by the optical fiber array,
a pitch matching waveguide portion of the lower-layer waveguide j transmits the one channel of signal light to a first coupling waveguide portion of the lower-layer waveguide j, the first coupling waveguide portion of the lower-layer waveguide j couples the one channel of signal light to a corresponding upper-layer amplification waveguide i, the upper-layer amplification waveguide i amplifies the one channel of signal light and then couples the one channel of amplified signal light to a second coupling waveguide portion of the lower-layer waveguide j, and the second coupling waveguide portion of the lower-layer waveguide j transmits the one channel of amplified signal light to the optoelectronics chip; and wherein the upper-layer amplification waveguide i is any one of the N upper-layer amplification waveguides, and the lower-layer waveguide j is any one of the N lower-layer waveguides.

15. The optical coupling system according to claim 13, wherein a pitch between first coupling waveguide portions of any two adjacent lower-layer waveguides of the N lower-layer waveguides is equal to a pitch between any two adjacent optical fibers in the optical fiber array, and a minimum pitch between pitch matching waveguide portions of any two adjacent lower-layer waveguides of the N lower-layer waveguides is equal to a pitch between any two adjacent optical waveguides in the optoelectronics chip.

16. The optical coupling system according to claim 14, wherein a maximum pitch between pitch matching waveguide portions of any two adjacent lower-layer waveguides of the N lower-layer waveguides is equal to a pitch between any two adjacent optical fibers in the optical fiber array, and a pitch between second coupling waveguide portions of any two adjacent lower-layer waveguides of the N lower-layer waveguides is equal to a pitch between any two adjacent optical waveguides in the optoelectronics chip.

17. The optical coupling system according to claim 12, wherein the N upper-layer amplification waveguides and the N lower-layer waveguides are all rectangular waveguides, a core layer height and a core layer width of the first core layer meet a single-mode transmission condition, and a core layer height and a core layer width of the second core layer meet the single-mode transmission condition.

18. A waveguide coupling method, applied to an optical coupling connector, wherein the optical coupling connector comprises an upper-layer connector and a lower-layer connector, wherein the upper-layer connector comprises N upper-layer amplification waveguides, wherein N is a positive integer greater than or equal to 2, the lower-layer connector comprises N lower-layer waveguides, wherein the N lower-layer waveguides and the N upper-layer amplification waveguides are coupled in a one-to-one correspondence, and each lower-layer waveguide comprises a first coupling waveguide portion, a second coupling waveguide portion, and a pitch matching waveguide portion, an optical fiber array comprises N optical fibers, wherein the N optical fibers provide N channels of signal light for the N lower-layer waveguides, and an optoelectronics chip comprises N optical waveguides, wherein first ends of the N lower-layer waveguides are connected to the N optical fibers in a one-to-one correspondence, and second ends of the N lower-layer waveguides are connected to the N optical waveguides in a one-to-one correspondence, each upper-layer amplification waveguide comprises a first core layer and a first covering layer that covers the first core layer, wherein a material of the first core layer comprises a gain material, the gain material can amplify signal light that is coupled to a corresponding upper-layer amplification waveguide by a lower-layer waveguide, and a refractive index of the first core layer is greater than a refractive index of the first covering layer, and each lower-layer waveguide comprises a second core layer and a second covering layer that covers the second core layer, wherein the second core layer is configured to transmit the signal light, and a refractive index of the second core layer is greater than a refractive index of the second covering layer, the method comprises:

receiving, by the lower-layer connector, N channels of signal light output by the optical fiber array;

coupling, by the lower-layer connector, the N channels of signal light to the upper-layer connector in a one-to-one correspondence; and separately amplifying, by the upper-layer connector, the N channels of signal light and then coupling the N channels of amplified signal light to the lower-layer connector; and outputting, by the lower-layer connector, the N channels of amplified signal light respectively to N optical waveguides of an optoelectronics chip.

19. The method according to claim 18, wherein the coupling, by the lower-layer connector, the N channels of signal light to the upper-layer connector in a one-to-one correspondence comprises:

coupling, by the first coupling waveguide portions of the N lower-layer waveguides in the lower-layer connector, the N channels of signal light to the upper-layer connector in a one-to-one correspondence.

20. The method according to claim 19, wherein the separately amplifying, by the upper-layer connector, the N channels of signal light and then coupling the N channels of amplified signal light to the lower-layer connector comprises:

injecting a carrier into the upper-layer connector, wherein the upper-layer connector separately amplifies the N channels of signal light by using the carrier and couples the N channels of amplified signal light respectively to the second coupling waveguide portions of the N lower-layer waveguides of the lower-layer connector.

* * * * *